US006835596B2

(12) United States Patent
Gotou et al.

(10) Patent No.: US 6,835,596 B2
(45) Date of Patent: Dec. 28, 2004

(54) METHOD OF MANUFACTURING A SEMICONDUCTOR DEVICE

(75) Inventors: Masakatsu Gotou, Atsugi (JP); Norihiko Kasai, Sagamihara (JP)

(73) Assignees: Renesas Technology Corp., Tokyo (JP); Hitachi Hokkai Semiconductor, Ltd., Hokkaido (JP)

( * ) Notice: Subject to any disclaimer, the term of this patent is extended or adjusted under 35 U.S.C. 154(b) by 0 days.

(21) Appl. No.: 09/965,221

(22) Filed: Sep. 28, 2001

(65) Prior Publication Data

US 2002/0038918 A1 Apr. 4, 2002

(30) Foreign Application Priority Data

Oct. 2, 2000 (JP) ........................................ 2000-301952

(51) Int. Cl.[7] .................. H01L 21/44; H01L 21/48; B29C 33/72; B29C 70/88
(52) U.S. Cl. .................. 438/107; 438/106; 438/128; 264/39; 264/272.17; 264/483
(58) Field of Search ...................... 438/106, 107, 438/128; 264/39, 272.17, 483

(56) References Cited

U.S. PATENT DOCUMENTS

| | | | |
|---|---|---|---|
| 5,729,437 A | | 3/1998 | Hashimoto |
| 5,939,792 A | * | 8/1999 | Ishikawa ................ 257/790 |
| 5,963,792 A | * | 10/1999 | Wensel ................... 438/106 |
| 6,200,121 B1 | | 3/2001 | Tsuruta |
| 6,338,813 B1 | * | 1/2002 | Hsu et al. .............. 264/272.14 |
| 6,344,162 B1 | * | 2/2002 | Miyajima ............... 264/272.14 |
| 6,462,421 B1 | * | 10/2002 | Hsu et al. ............... 257/777 |

FOREIGN PATENT DOCUMENTS

| | | |
|---|---|---|
| JP | 8-107161 | 4/1996 |
| JP | 2000-12578 | 1/2000 |

* cited by examiner

*Primary Examiner*—Alexander Ghyka
(74) *Attorney, Agent, or Firm*—Antonelli, Terry, Stout & Kraus, LLP

(57) ABSTRACT

An improvement of the yield of semiconductor devices is achieved in the manufacture of a semiconductor device. The method includes forming a resin enclosure for block-molding a plurality of semiconductor chips by placing a plurality of semiconductor chips inside a cavity of a molding die along with a substrate, and then injecting a resin from a first side to a second side of a main surface of the substrate. The plurality of semiconductor chips are mounted on the main surface of the substrate from the first side to the second side of the main surface with a predetermined spacing, the second side facing the first side. The method is characterized by the application of cleaning treatment to the main surface of the substrate before forming the resin enclosure.

37 Claims, 26 Drawing Sheets

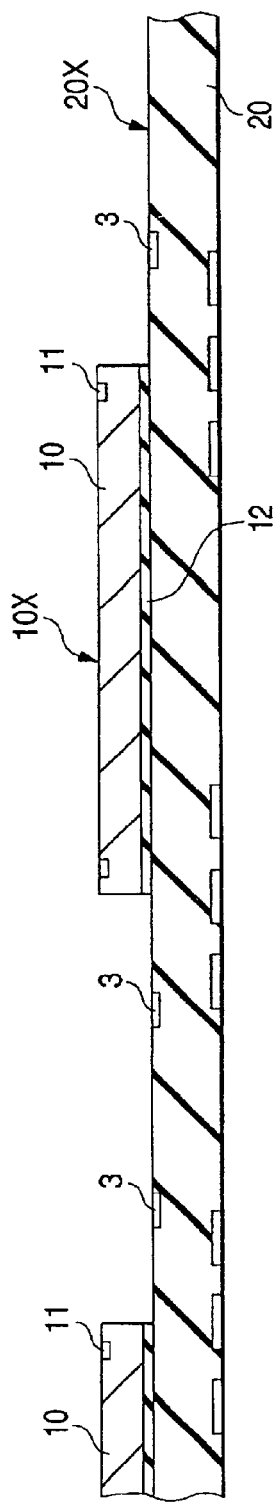
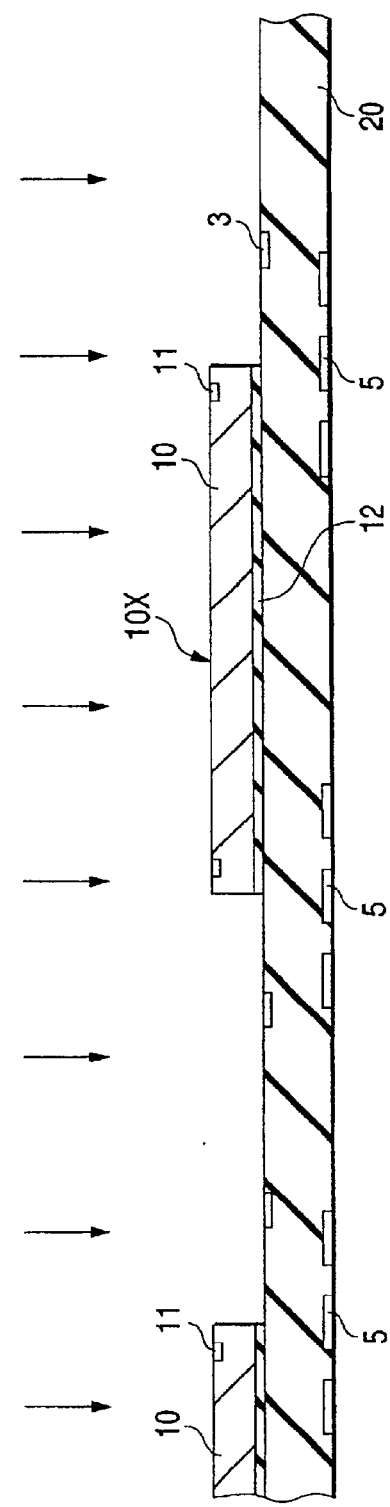

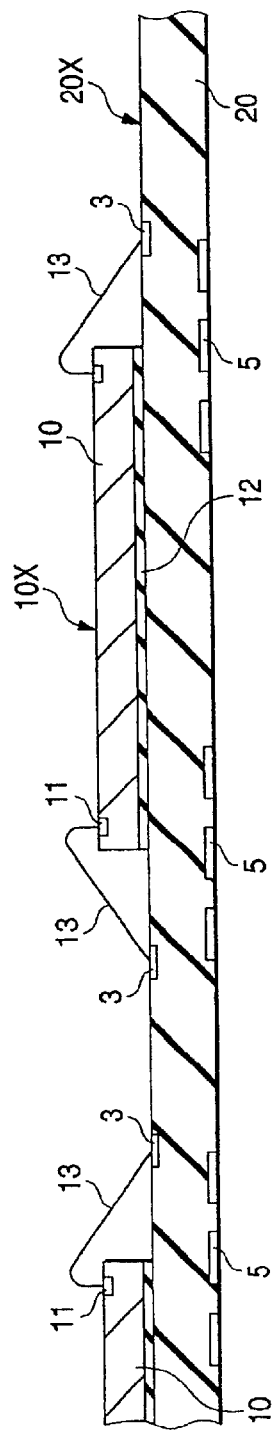
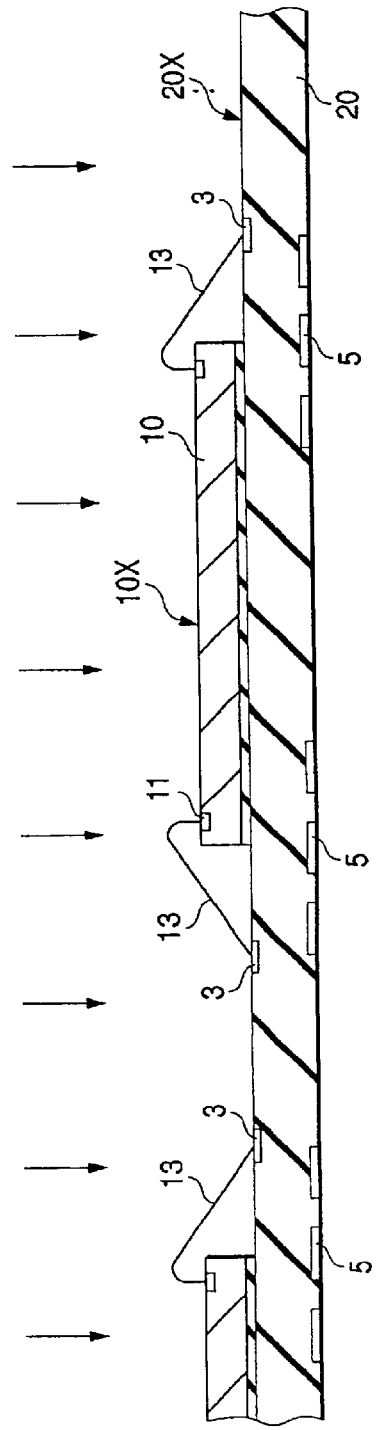

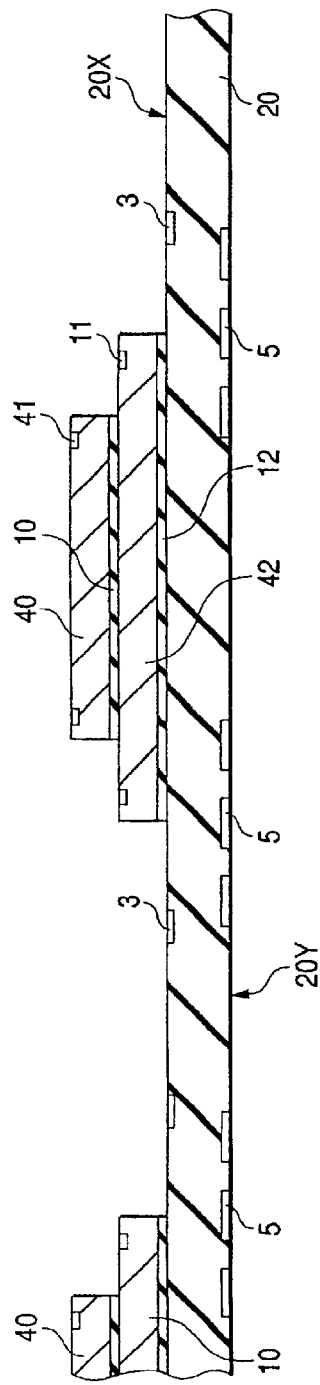
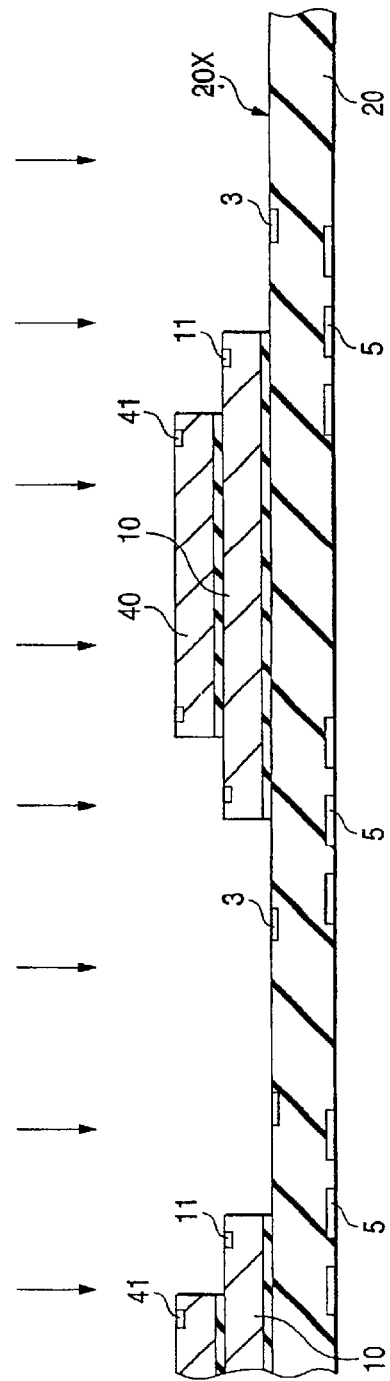
FIG. 18A
FIG. 18B

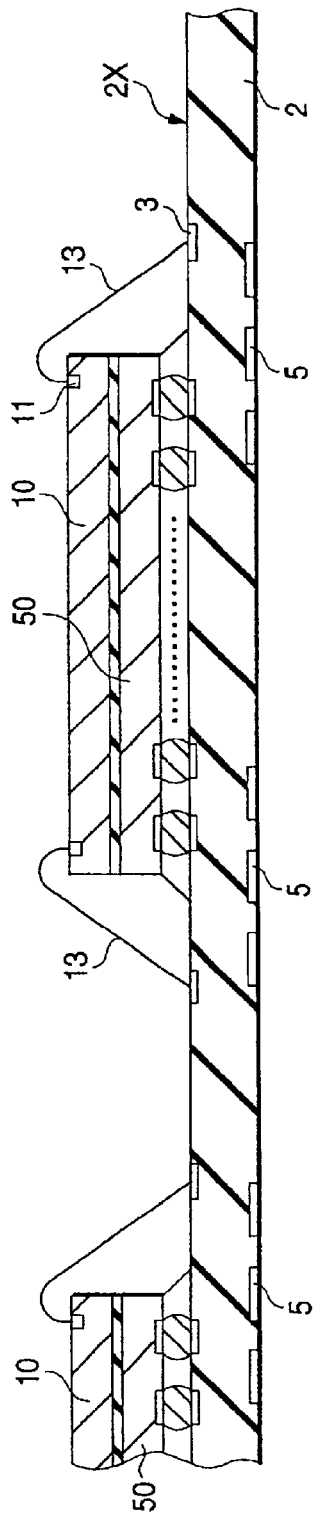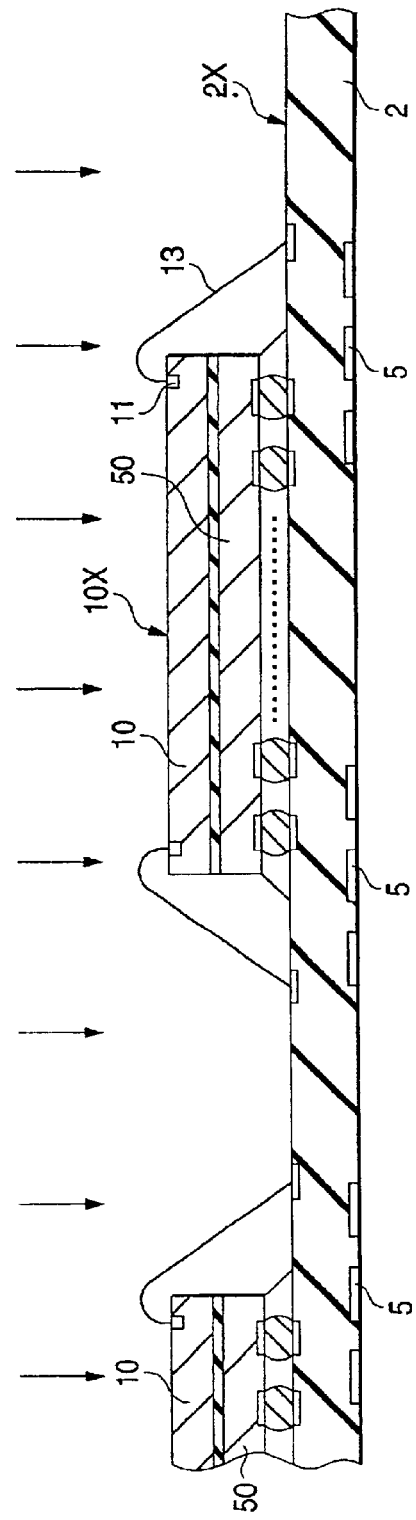

METHOD OF MANUFACTURING A SEMICONDUCTOR DEVICE

BACKGROUND OF THE INVENTION

The present invention relates to a technique for use in the manufacture of a semiconductor device, particularly, to an effective technique that is suitable for the manufacture of a semiconductor device using block molding by transfer molding.

In the manufacture of a semiconductor device, a method is known in which a plurality of semiconductor chips mounted on a main surface of a substrate are block-molded with one resin enclosure, and then the resin enclosure and the substrate are simultaneously separated into respective semiconductor chips. This manufacturing method is disclosed in Japanese patent Laid-Open No. 107161/1996 (U.S. Pat. No. 5,729,437) (publicly known document 1) and Japanese patent Laid-Open No. 12578/2000 (U.S. Pat. No. 6,200,121) (publicly known document 2), for example. More particularly, the publicly known document 1 discloses a method of forming a resin enclosure for block molding by potting, and the publicly known document 2 discloses a method of forming a resin enclosure for block molding by transfer molding.

SUMMARY OF THE INVENTION

The inventors have studied the method for forming a resin enclosure for block molding by transfer molding (hereafter called block transfer molding). Consequently, they have found the following problems.

FIGS. 23A to 26B are diagrams illustrating resin flows when a resin enclosure is formed by block transfer molding in traditional semiconductor device manufacture. In FIGS. 23A to 26B, 60 denotes a substrate, 60X denotes a main surface of the substrate 60, 61 denotes a semiconductor chip, 62 denotes a molding die, 62A denotes an upper mold of the molding die 62, 62B denotes a bottom mold of the molding die 62, 63 denotes a cavity, 64 denotes a gate, 65 denotes a runner, 66 denotes an air vent, 67A denotes a resin, 67B denotes a void and S denotes a resin injecting direction.

Block transfer molding is adopted in the manufacture of a BGA (Ball Grid Array) semiconductor device and a CSP (Chip Size Package or Chip Scale Package) semiconductor device having a package structure with a substrate. In the manufacture of these types of semiconductor devices, the substrate 60, where a plurality of product forming areas 60A are arranged on the main surface 60X in matrix form with a predetermined spacing, is used, as shown in FIG. 23A. Therefore, a plurality of semiconductor chips 61 mounted on the substrate 60 are also arranged in matrix form with a predetermined spacing.

In block transfer molding, the molding die 62, having a cavity 63, gates 64, runners 65, a cull (not shown), pots (not shown) and air vents 66, is used as shown in the drawing. The resin 67A is injected inside the cavity 63 from the pots through the culls, the runners 65 and the gates 64.

Since a substrate 60 having a rectangular plane is generally used, the plane shape of the cavity 63 is also formed into a corresponding rectangular shape. In such case, a plurality of gates 64 are disposed along one of the two long sides of the cavity 63 so that the resin 67A will evenly fill the inside of the entire cavity 63. Thus, the resin 67A is injected inside the cavity 63 from one long side to the other long side of the substrate 60. The resin 67A thus injected inside the cavity 63 flows from one long side to the other long side of the substrate 60 as shown progressively in FIGS. 23A to 25B, and eventually fills the inside the cavity 63, as shown in FIGS. 26A and 26B.

Meanwhile, the resin 67A that has been injected inside the cavity 63 flows along a main surface and the side surfaces of each semiconductor chip 61. The resin 67A flowing along the main surface and the side surfaces of a semiconductor chip 61 runs between the semiconductor chips 61. However, the flow of the resin 67A along the main surface of the semiconductor chip 61 is resisted by the semiconductor chip 61. Therefore, it runs slower than the resin 67A flowing along the side surfaces of the semiconductor chip 61 (see FIGS. 24A and 24B). For this reason, voids 67B tend to be generated at positions where the resin 67A flowing along the main surface of the semiconductor chip 61 meets the resin 67A flowing along the side surfaces of the semiconductor chip 61 (see FIGS. 25A and 25B). The voids 67B gradually become smaller as they are moved by the flow of the resin 67A in the resin injecting process. However, voids 67C remain at positions hiding behind the semiconductor chips 61 with respect to the injecting direction S of the resin 67A (see FIGS. 26A and 26B).

In transfer molding, there is a process for reducing voids that have been caught in the resin by applying a higher injection pressure after resin filling is complete. However, the voids 67C are considerably greater than voids of the type that do not cause the popcorn phenomenon during temperature cycle testing, even though this process is applied. Thus, they become a factor that reduces the yields of semiconductor devices.

The aforementioned publicly known document 1 (Japanese patent Laid-Open No. 107161/1996) discloses the use of a molding material having a low thixotropic property, and further employs vacuum defoaming as a means of preventing the generation of unfilled portions. However, in transfer molding, application of the aforesaid technique cannot solve the problem of void generation.

When transfer molding is adopted, the resin flow is to be controlled by injection from the gates. Therefore, air vents are disposed at positions facing the gates and in areas where the resin is finally filled, and, thereby, air inside the cavity can be removed from the air vents until the resin is filled inside the cavity. However, in transfer molding, when the thixotropic property is reduced to the extent that the resin flow is governed by the thixotropic property, or the resin injecting rate is decreased, it becomes difficult to control the resin flow, and it becomes substantially impossible to set the positions of the air vents that have to be disposed in areas where the resin is finally filled. Accordingly, in transfer molding, it is virtually impossible to control the conditions of the resin in the injecting process and to eliminate generation of voids by adopting a material having a low thixotropic property as the resin.

Additionally, when a great amount of a filler (80% or more, for example) is added to a molding resin for the purpose of reducing warpage due to the cure shrinkage of the molding resin to facilitate the dicing process, or for the purpose of providing a thermal expansion coefficient of the resin closer to that of a semiconductor chip to reduce the stress applied to the semiconductor chip during heat cycling, the existence of the filler increases the thixotropic property even though those resins having a low thixotropic property are adopted as a molding material. Therefore, a low thixotropic property is insufficient as a means of solving the void catching problem.

Furthermore, in potting, a method, such as vacuum defoaming, can be adopted in which air bubbles are removed outside a resin by placing semiconductor devices, that are in a state in which the resin has not been cured, in a low-pressure atmosphere after potting. However, in transfer molding, resin injection and curing are performed inside the cavity, and thus the method for reducing voids by vacuum defoaming cannot be adopted. Consequently, in transfer molding, applying techniques described in the publicly known document 1 cannot prevent the problem of void generation. Therefore, new methods need to be adopted for preventing voids.

Accordingly, the inventors have turned their attention to the wettability of the resin 67A to the main surface of the substrate 60 to develop a technique to prevent the generation of voids 67C which remain on the main surface of the substrate 60, as shown in FIGS. 26A and 26B.

The object of the present invention is to provide techniques capable of improving the yield of semiconductor devices.

The aforementioned object, other objects and new features of the invention will be apparent from the following description and the accompanying drawings.

Among the aspects of invention disclosed in the present application, the following is the brief description of a summary of representative features.

(1) A method of manufacturing a semiconductor device comprises forming a resin enclosure for block-molding of a plurality of semiconductor chips by placing a plurality of semiconductor chips inside a cavity of a molding die along with a substrate and then injecting a resin inside the cavity from a first side to a second side along a main surface of the substrate, the plurality of semiconductor chips being mounted on the main surface of the substrate in an arrangement from the first side to the second side of the main surface with a predetermined spacing, the second side facing the first side, wherein the method further comprises removing impurities remaining on the main surface of the substrate before forming the resin enclosure. Removing impurities remaining on the main surface of the substrate is performed by plasma cleaning.

(2) A method of manufacturing a semiconductor device comprises forming a resin enclosure for block-molding of a plurality of semiconductor chips by placing a plurality of semiconductor chips inside a cavity of a molding die along with a substrate and then injecting a resin inside the cavity from a first side to a second side along a main surface of the substrate, the plurality of semiconductor chips being mounted on the main surface of the substrate in an arrangement from the first side to the second side with a predetermined spacing, the second side facing the first side, wherein the method further comprises the application of surface roughening treatment to the main surface of the substrate before forming the resin enclosure. The surface roughening treatment is performed by plasma cleaning.

BRIEF DESCRIPTION OF THE DRAWINGS

The teachings of the invention can be readily understood by considering the following detailed description in conjunction with the accompanying drawings, in which:

FIGS. 9A and 9B are schematic sectional views illustrating steps in the fabrication of the semiconductor device of the embodiment 1;

FIGS. 10A and 10B are schematic sectional views illustrating steps in the fabrication of the semiconductor device of the embodiment 1;

FIGS. 18A and 18B are schematic sectional views illustrating steps in the fabrication of the semiconductor device of the embodiment 2;

FIGS. 22A and 22B are schematic sectional views illustrating steps in the fabrication of the semiconductor device of the embodiment 3;

DESCRIPTION OF THE PREFERRED EMBODIMENT

Hereafter, various embodiments of the invention will be described in detail with reference to the drawings. Additionally, in all of the drawings of the embodiments, those elements having the same functions are designated with the same numerals and signs, and a repeated description thereof is omitted.

(Embodiment 1)

In this embodiment, an example in which the invention is applied to a BGA semiconductor device will be described.

Figure 1A:
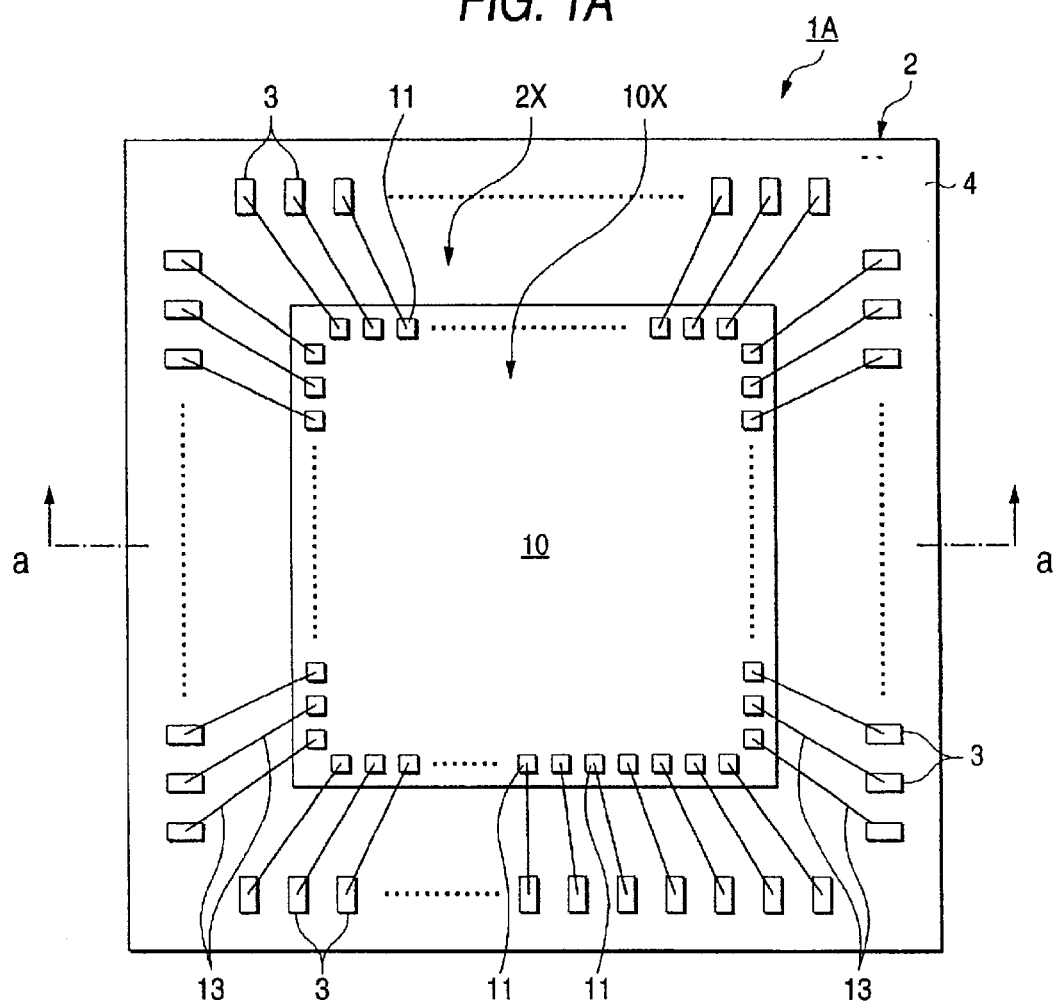
FIG. 1A is a schematic plan view of a semiconductor device representing an embodiment 1 of the invention.
Figure 1B:
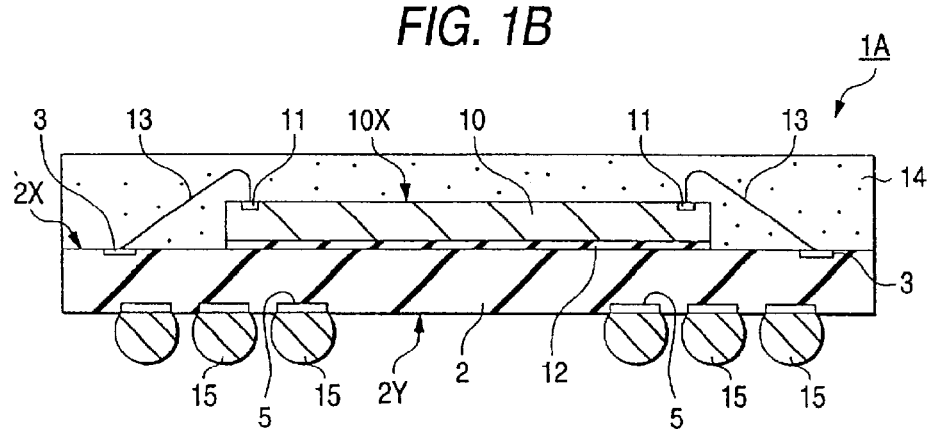
FIG. 1B is a schematic sectional view taken along a line a—a in FIG. 1A.

FIGS. 1A and 1B are schematic diagrams illustrating the configuration of the semiconductor device of embodiment 1 of the invention. In FIG. 1A, the semiconductor device is shown with the resin enclosure removed.

Figure 2:
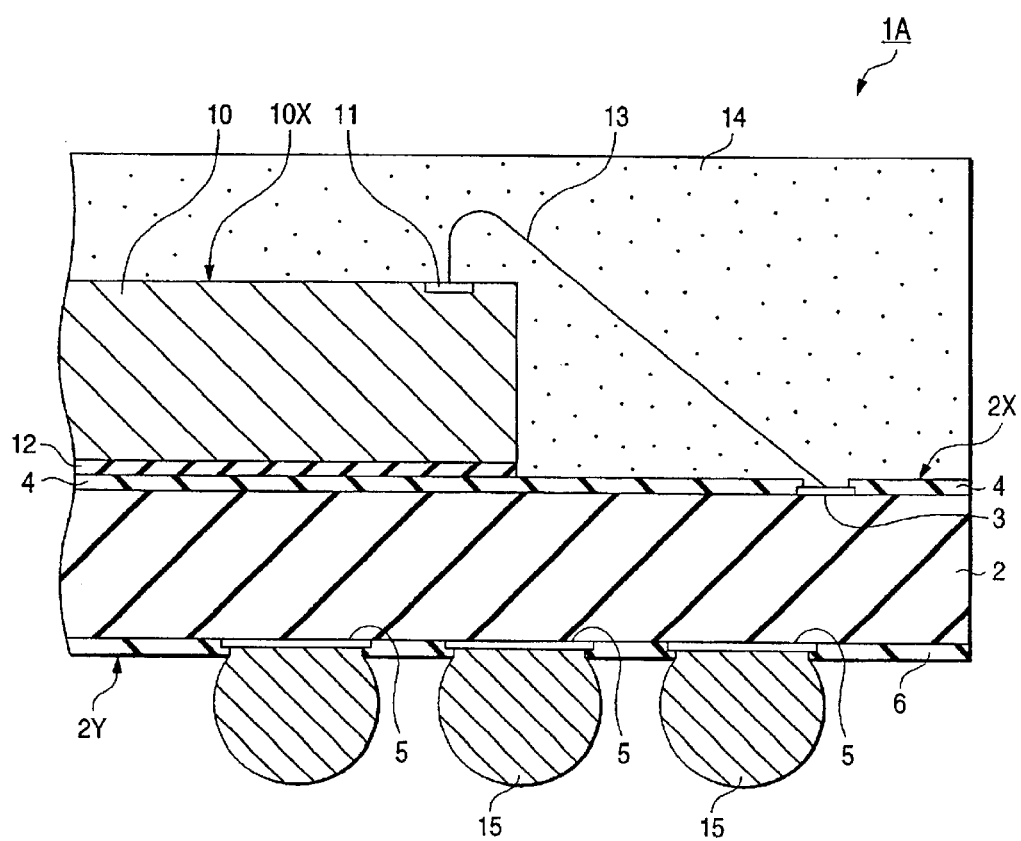
FIG. 2 is an enlarged schematic sectional view showing a part of FIG. 1B.

As shown in FIGS. 1A, 1B and 2, a semiconductor device 1A is configured to mainly have a substrate (circuit board) 2, a semiconductor chip 10, a plurality of bonding wires 13, a resin enclosure 14 and a plurality of projecting electrodes 15. The semiconductor chip 10 and the plurality of bonding wires 13 are encapsulated with the resin enclosure 14.

The semiconductor chip 10 is attached and fixed to a main surface 2X of the substrate 2 through a bonding layer 12, and the main surface 2X (chip mounting surface) faces the other main surface (back surface) 2Y of the substrate 2. The semiconductor chip 10 is formed to have a rectangular shape; more particularly, it is formed to have a square shape in the illustrated embodiment, for example. The semiconductor chip 10 is configured to have a semiconductor substrate made of monocrystal silicon, multilevel interconnection layers having a plurality of insulating layers and wiring layers laminated on the circuit forming side of the semiconductor substrate, and a surface protecting film deposited to cover the multilevel interconnection layers, for example. As the surface protecting film, a polyimide resin is used, for instance.

The semiconductor chip 10 is provided with a control circuit, for example, as an integrated circuit. The control circuit is mainly configured of transistor devices formed on the circuit forming surface of the semiconductor substrate and wirings formed in the wiring layers.

A plurality of electrode pads (bonding pads) 11 are formed on a main surface 10X of the semiconductor chip 10 along each of the sides around the semiconductor chip 10, and the main surface 10X (circuit forming surface) faces the other main surface (back surface) of the semiconductor chip 10. Each of the plurality of electrode pads 11 is formed on the top most wiring layer, among the multilevel interconnection layers of the semiconductor chip 10, which is electrically connected to the transistor devices constituting the control circuit. Each of the plurality of electrode pads 11 is formed a metal film, such as an aluminium (Al) film or aluminium alloy film.

The substrate 2 is not shown in detail, but it has a multilevel interconnection structure where each of the insulating layers and conductive layers is sequentially laminated. Each of the insulating layers is formed of a glass-epoxy substrate where glass fibers are impregnated with an epoxy resin, and each of wiring layers is formed of a metal film made of copper (Cu), for example. The substrate 2 is formed to have a rectangular shape; more particularly, it is formed to have a square shape in the illustrated embodiment, for example.

The main surface 2X of the substrate 2 has disposed with thereon plurality of connecting parts (lands) 3 made of a part of wirings formed in the topmost conductive layer thereof. Additionally, a resin film 4 for protecting the wirings formed in the topmost conductive layer thereof is deposited on the main surface 2X of the substrate 2. The resin film 4 is formed with apertures for exposing the surfaces of the connecting parts 3.

The back surface 2Y of the substrate 2 has disposed thereon a plurality of electrode pads (lands) 5 made of a part of the wirings formed in the undermost conductive layer thereof. Furthermore, the back surface 2Y of the substrate 2 has deposited thereon a resin film 6 for protecting the formed in the undermost conductive layer thereof. The resin film 6 is formed with apertures for exposing the surfaces of the electrode pads 5. The resin films 4 and 6 are formed of an epoxy resin or polyimide resin, for example.

Each of the plurality of bump electrodes 15 is fixed to the plurality of electrode pads 5 disposed on the back surface 2Y of the substrate 2, to which they are electrically and mechanically connected. The projecting bump electrodes 15 are formed of a ball-like bump made of a solder material having Pb—Sn composition, for example.

The resin enclosure 14 is formed to have a rectangular shape; more particularly, it is formed to have a square shape in the illustrated embodiment, for example. The resin enclosure 14 is formed of an epoxy thermosetting insulating resin having an addition a phenol curing agent, a silicon rubber and many fillers (silica, for example) for the purpose of providing a low stress.

Each of the plurality of electrode pads 11 disposed on the main surface 10X of the semiconductor chip 10 is electrically connected to the plurality of connecting parts 3 disposed on the main surface 2X of the substrate 2 through the bonding wires 13. As the bonding wires 13, gold (Au) wires are used, for example. As a method of connecting the bonding wires 13, boll bonding (nail head bonding) that combines thermo-compression bonding with ultrasonic vibration is used.

The resin enclosure 14 and the substrate 2 have almost the same outer shapes and sizes, and the side surfaces of the resin enclosure 14 and the substrate 2 are substantially flush. In fabricating the semiconductor device 1A of the embodiment, a fabricating method is adopted in which a plurality of semiconductor chips 1C mounted on the main surface of the substrate with a predetermined spacing are block-molded using a resin enclosure, and then the resin enclosure and the substrate are simultaneously separated into respective semiconductor chips 10 (each of the product forming areas) The method will be more specifically described later.

Figure 3:
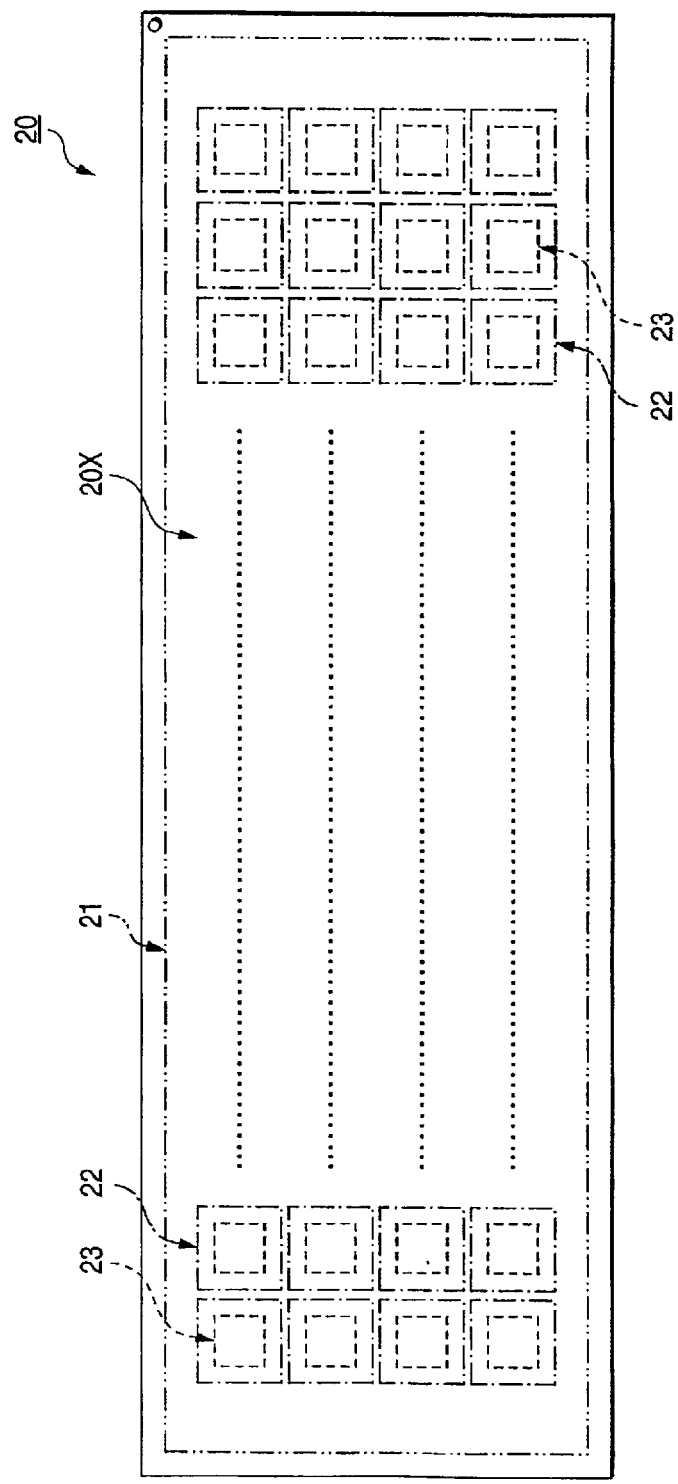
FIG. 3 is a schematic plan view of a substrate (a substrate for separation) for use in fabricating the semiconductor device of the embodiment 1.
Figure 4:
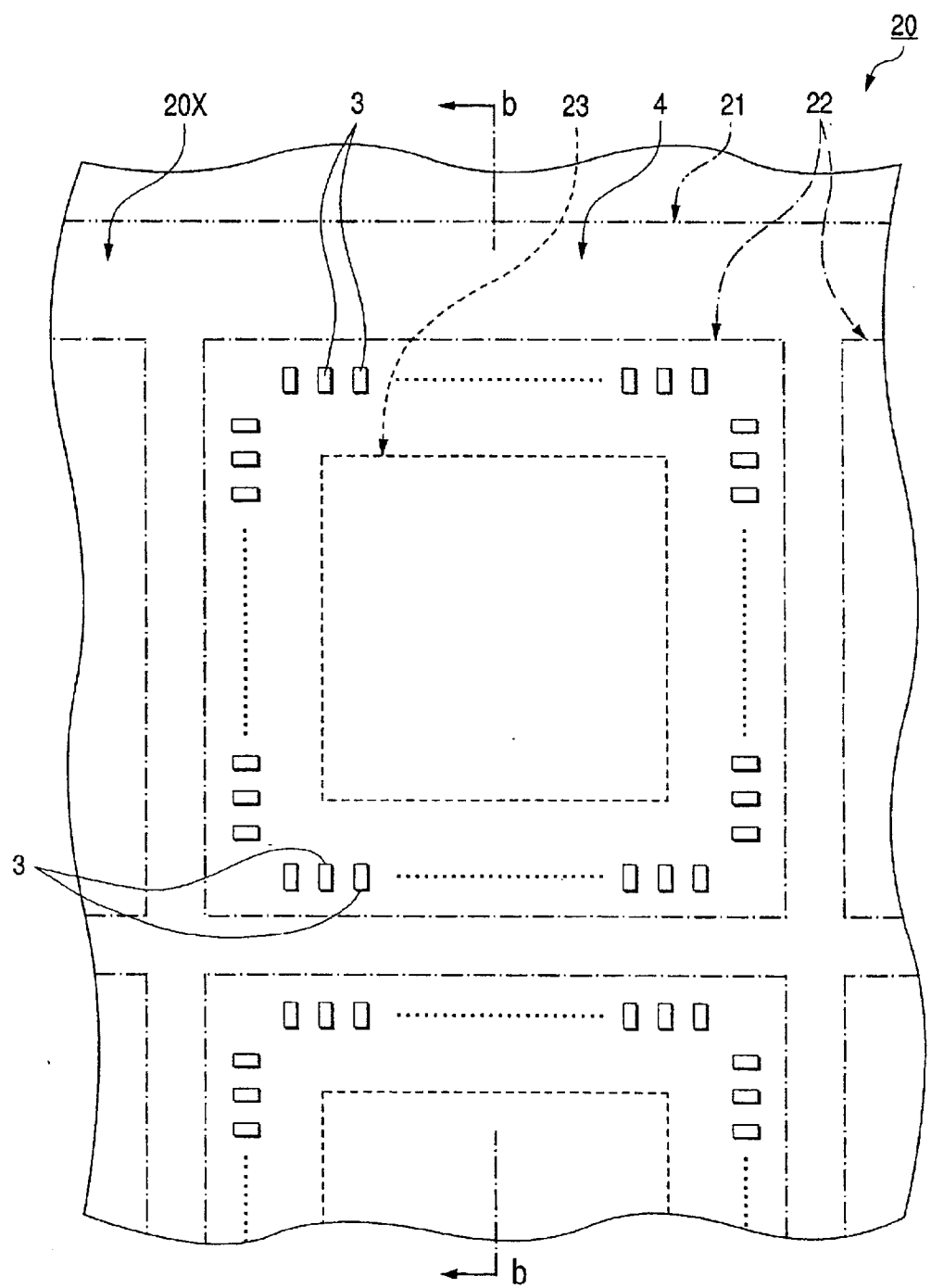
FIG. 4 is an enlarged schematic plan view showing a part of FIG. 3.
Figure 5:
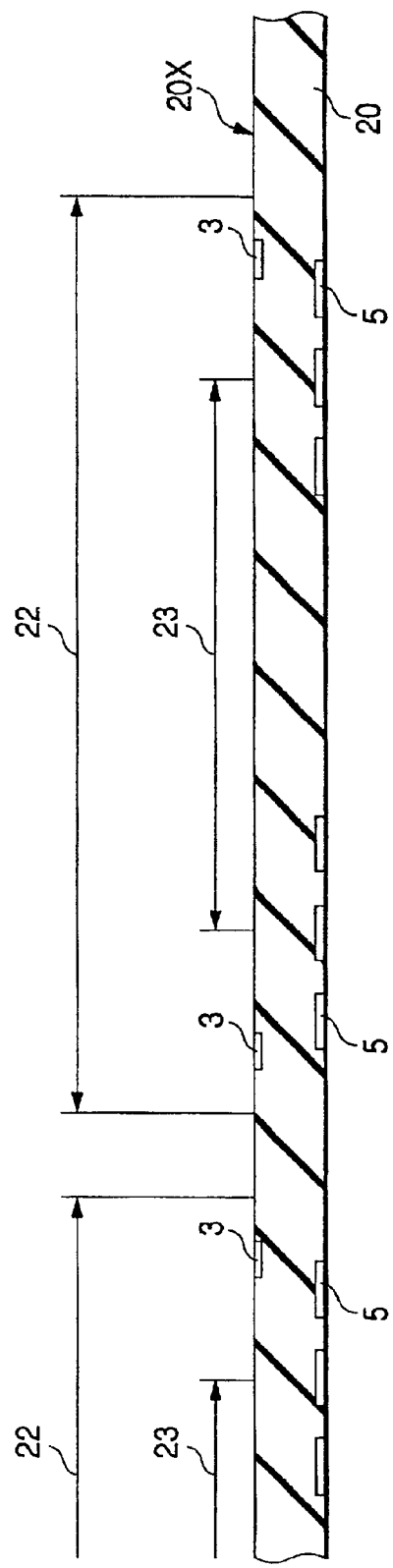
FIG. 5 is a schematic sectional view taken along a line b—b in FIG. 4.

FIG. 3 is a schematic plan view illustrating a substrate for use in fabricating the semiconductor device 1A of the embodiment. FIG. 4 is a schematic plan view of a part of FIG. 3. FIG. 5 is a schematic sectional view taken along a line b—b in FIG. 4.

As shown in FIGS. 3 to 5, the substrate (circuit board) 20 is formed to have a rectangular shape; more particularly, it is formed to have a square shape in the illustrated embodiment, for example. On a main surface (chip mounting surface) 20X of the substrate 20, a plurality of product forming areas 22 are arranged in a matrix form with a predetermined spacing. Each of the product forming areas 22 is disposed with a chip mounting area 23, and a plurality of connecting parts 3 are arranged therearound. Each of the product forming areas 22 is disposed in a molding area 21 where a resin enclosure is formed. Each of the product forming areas 22 is configured to have the same configuration as the substrate 2. That is, a resin film 4 is deposited over the entire main surface 20X of the substrate 20, and a resin film 6 is deposited over the entire other main surface (back surface) facing the main surface 20X. Additionally, the product forming areas 22 are spaced from each other through a separation area for separating the substrate 20.

Figure 6:
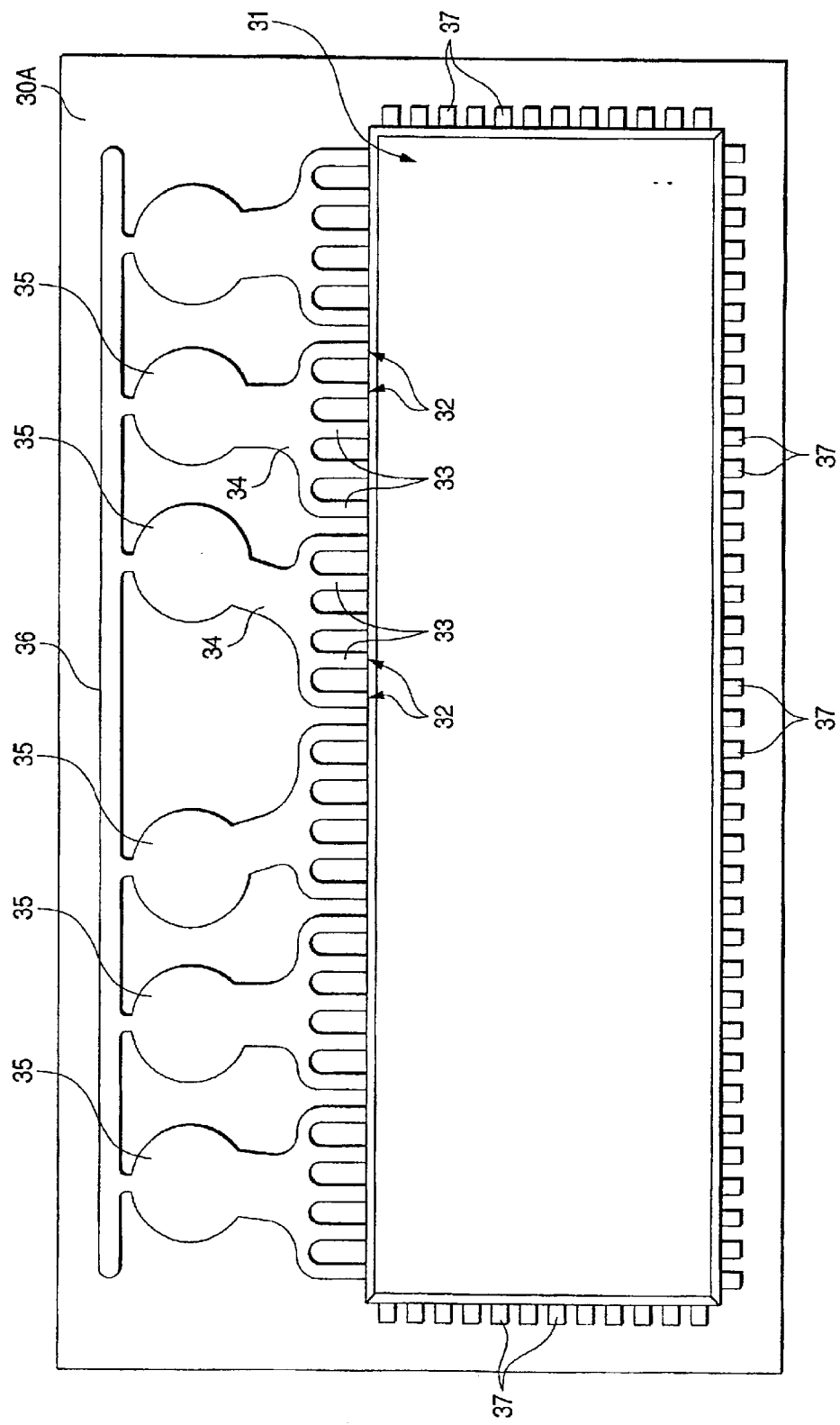
FIG. 6 is a schematic plan view illustrating the configuration of an upper mold of a molding die for use in fabricating the semiconductor device of the embodiment 1.
Figure 7:
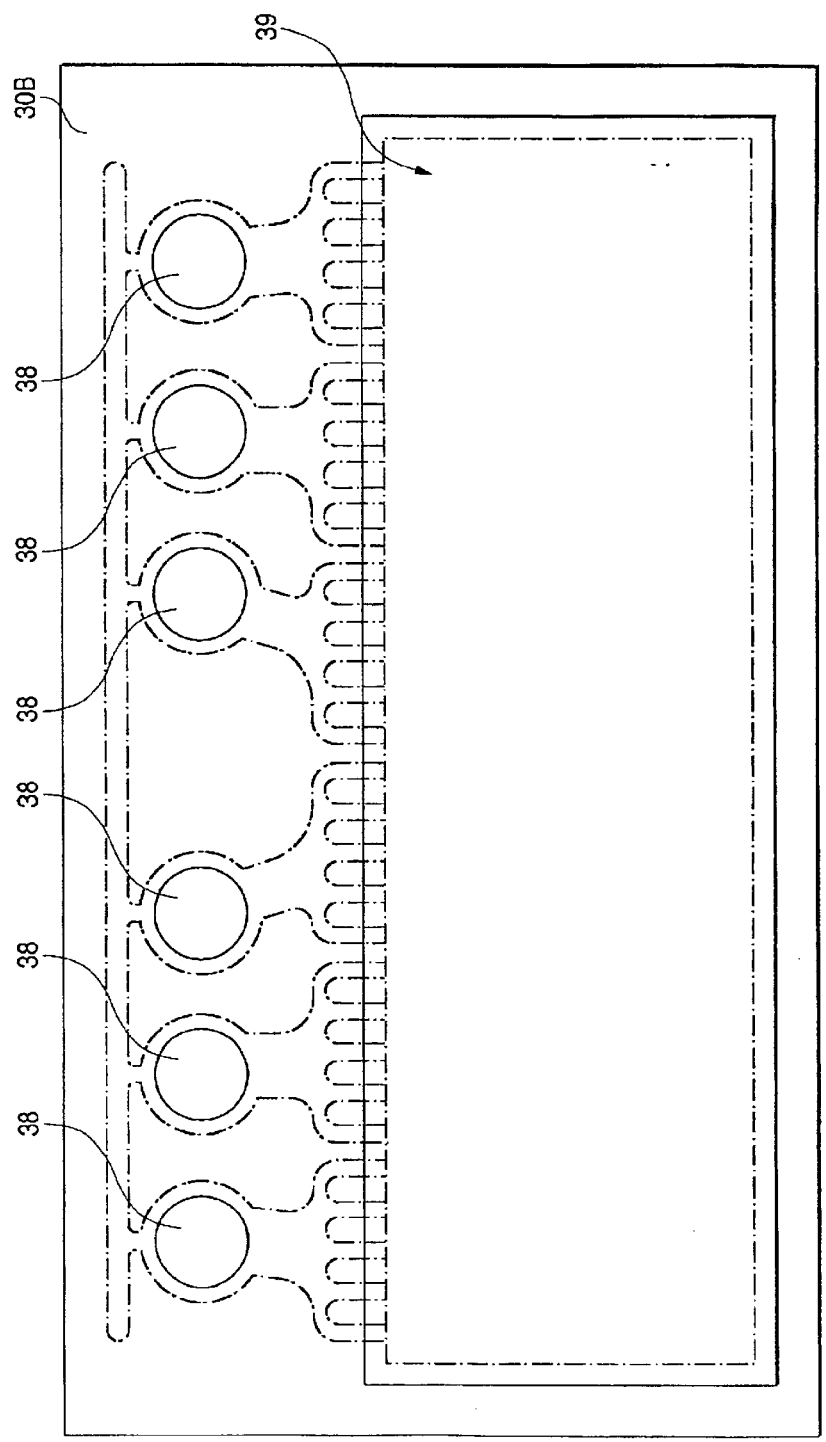
FIG. 7 is a schematic plan view illustrating the configuration of a bottom mold of the molding die for use in fabricating the semiconductor device of the embodiment 1.
Figure 8:
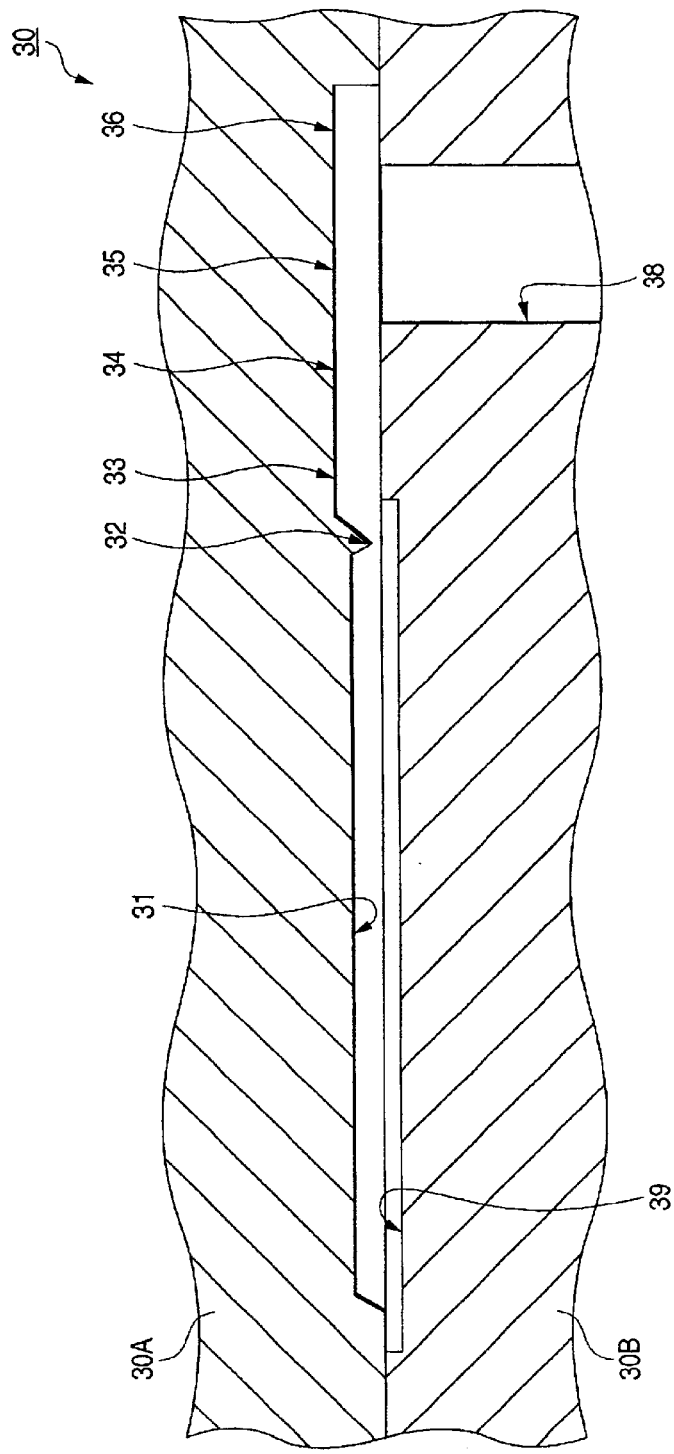
FIG. 8 is a schematic sectional view illustrating the configuration of the molding die for use in fabricating the semiconductor device of the embodiment 1.

FIG. 6 is a schematic plan view illustrating the configuration of an upper mold of a molding die for use in fabricating the semiconductor device 1A of the embodiment. FIG. 7 is a schematic plan view illustrating the configuration of a lower or bottom mold of the molding die. FIG. 8 is a schematic sectional view illustrating the configuration of the molding die.

As shown in FIGS. 6 to 8, a molding die 30 has a cavity 31, a plurality of gates 32, a plurality of subrunners 33, a plurality of main runners 34, a plurality of culls 35, a joining runner 36, a plurality of air vents 37, a plurality of pots 38 and a substrate mounting area 39. Each of the component parts 31 to 37 is disposed in an upper mold 30A and each of the component parts 38 and 39 is disposed in the bottom mold 30B. The cavity 37 and the substrate mounting area 39 are formed to have a plane shape corresponding to the plane shape of the substrate 20; that is, they are formed to have a rectangular shape in the illustrated embodiment, for example. The cavity 31 is recessed from the mating face of the upper mold 30A in the depth direction. The substrate mounting area 39 is recessed from the mating face of the bottom mold 30B in the depth direction.

In the molding die 30, a resin is injected inside the cavity 31 from the pots 38 through the culls 35, the main runners 34, the subrunners 33 and the gates 32. The plurality of gates 32 are arranged along one of the two long sides of the cavity 31 corresponding each other so as to evenly fill the inside of the entire cavity 31 with resin. Thus, the resin is injected inside the cavity 31 from one long side to the other long side of the cavity 31. The plurality of air vents 37 are arranged along three sides, except for the long side of the cavity 31 where the gates 32 are disposed.

Next, the fabrication of the semiconductor device 1A of the embodiment will be described with reference to FIGS. 9A to 16B. FIGS. 9A, 9B, 10A, 10B, 11, 16A and 16B are schematic sectional views illustrating the fabrication of the semiconductor device. FIGS. 12A to 15B are diagrams illustrating the resin flow when a resin enclosure is formed by block transfer molding.

First, the substrate 20 shown in FIG. 3 is prepared. Then, a bonding layer 12 made of an epoxy thermosetting resin, for example, is deposited on the chip mounting area in each of the product forming areas on the main surface 20X of the substrate 20. The semiconductor chip 10 is mounted on each of the chip mounting areas through the bonding layer 12. Heat treatment is applied to cure the bonding layer 12. The semiconductor chip 10 is attached and fixed in each of the chip mounting areas, as shown in FIG. 9A. In this process, the substrate 20 is heated at a temperature of about 150° C., for example, and therefore a natural oxide film is formed on the surfaces of the electrode pads 11 of the semiconductor chip 10 and the surfaces of the connecting parts 3 of the substrate 20. Additionally, impurities, such as fats, oils and organic solvents contained in the resin film 4, are outgassed to contaminate the main surface 20X and the surfaces of the connecting parts 3 of the substrate 20 and the surfaces of electrode pads 11.

Subsequently, as shown in FIG. 9B, cleaning treatment is applied to the surfaces of the electrode pads 11 of the semiconductor chip 10 and the surfaces of the connecting parts 3 of the substrate 20 to remove impurities, such as the natural oxide film, fats, oils and organic solvents, remaining on these surfaces. The cleaning treatment is performed by plasma cleaning using an oxygen or argon gas, for example.

Then, as shown in FIG. 10A, the electrode pads 11 of the semiconductor chip 10 are electrically connected to the connecting parts 3 of the substrate 20 using the bonding wires 13. In this process, since impurities, such as the natural oxide film, fats, oils and organic solvents, remaining on the surfaces of the electrode pads 11 of the semiconductor chip 10 and the surfaces of the connecting parts 3 of the substrate 20, have been removed in the previous cleaning process, the connection reliability in the wire bonding process is enhanced. Furthermore, in this process, the substrate 20 is heated at a temperature of about 125° C., for example. Thus, impurities, such as fats, oils and organic solvents contained in the resin film 4, are outgassed so as to contaminate the main surface 20X of the substrate 20. Moreover, in this process, a plurality of semiconductor chips 10 are mounted on the main surface 20X of the substrate 20.

Subsequently, as shown in FIG. 10B, cleaning treatment is applied to the main surface 20X of the substrate 20 to remove impurities, such as fats, oils and organic solvents remaining on the main surface 20X of the substrate 20. This cleaning treatment is performed by plasma cleaning using an oxygen or argon gas. Plasma cleaning can remove impurities, such as fats and oils, and can roughen the surface of the main surface 20X of the substrate 20.

Figure 11:
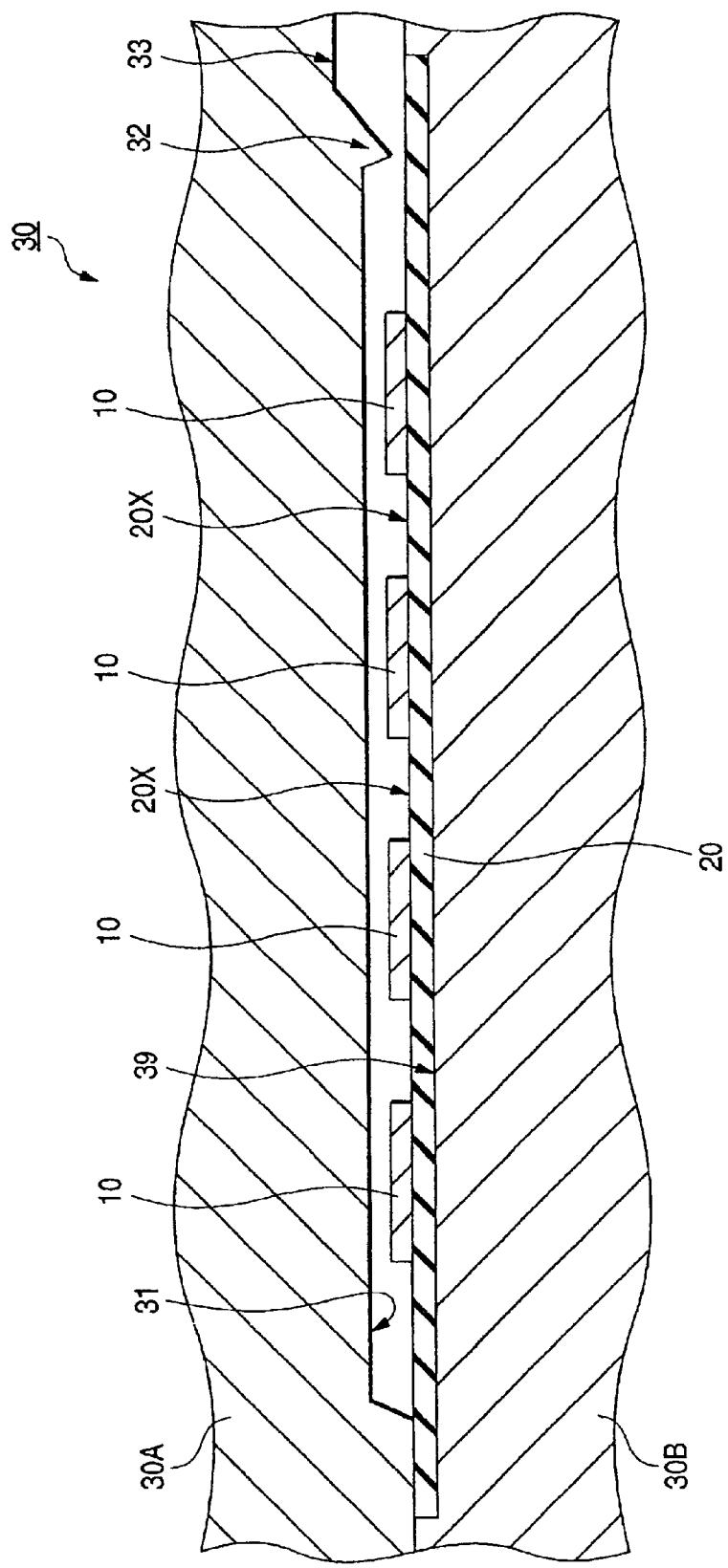
FIG. 11 is a schematic sectional view illustrating a step in the fabrication of the semiconductor device of the embodiment 1.

Then, as shown in FIG. 11, the substrate 20 is positioned between the upper mold 30A and the lower or bottom mold 30B of the molding die 30, and the plurality of semiconductor chips 10 mounted on the main surface 20X of the substrate 20 are placed inside the cavity 31 of he molding die 30 along with the substrate 20. At this time, the substrate 20 is mounted on the substrate mounting area 39 disposed in the bottom mold 30B.

Subsequently, an epoxy thermosetting resin, for example, is injected inside the cavity 31 from the pods 38 through the culls 35, the main runners 34, the subrunners 33 and the gates 32 to form a resin enclosure 24 for block-molding the plurality of semiconductor chips 10 mounted on the main surface 20X of the substrate 20.

Figure 12A:
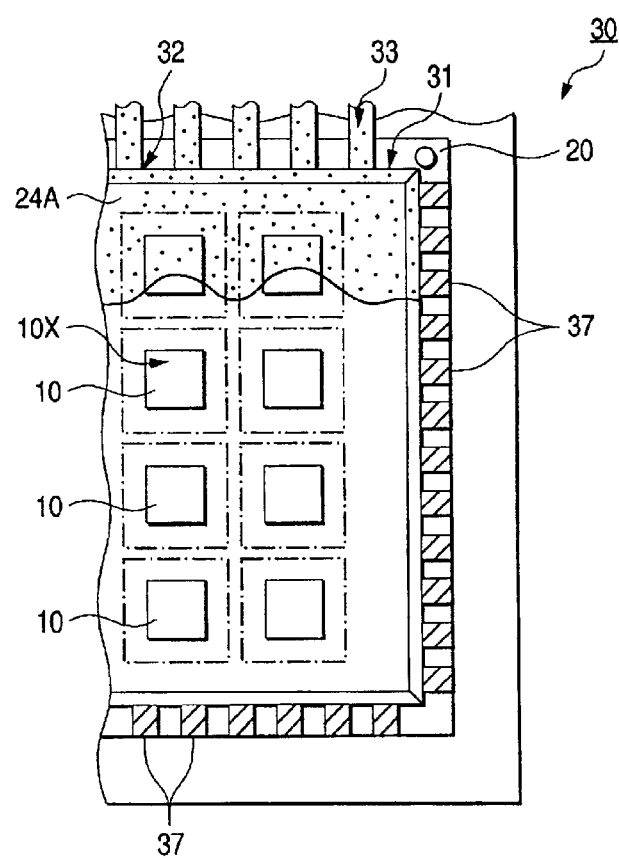
FIG. 12A is a schematic plan view illustrating the resin molding process used in fabricating the semiconductor device of the embodiment 1.
Figure 12B:
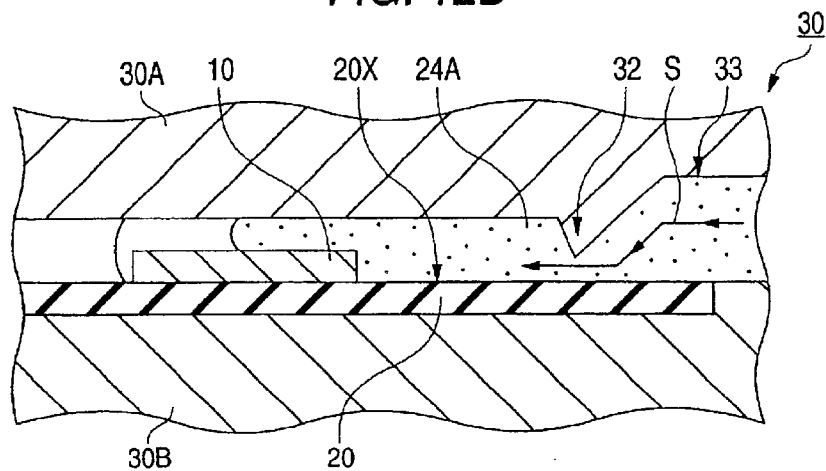
FIG. 12B is a schematic sectional view thereof.
Figure 13A:
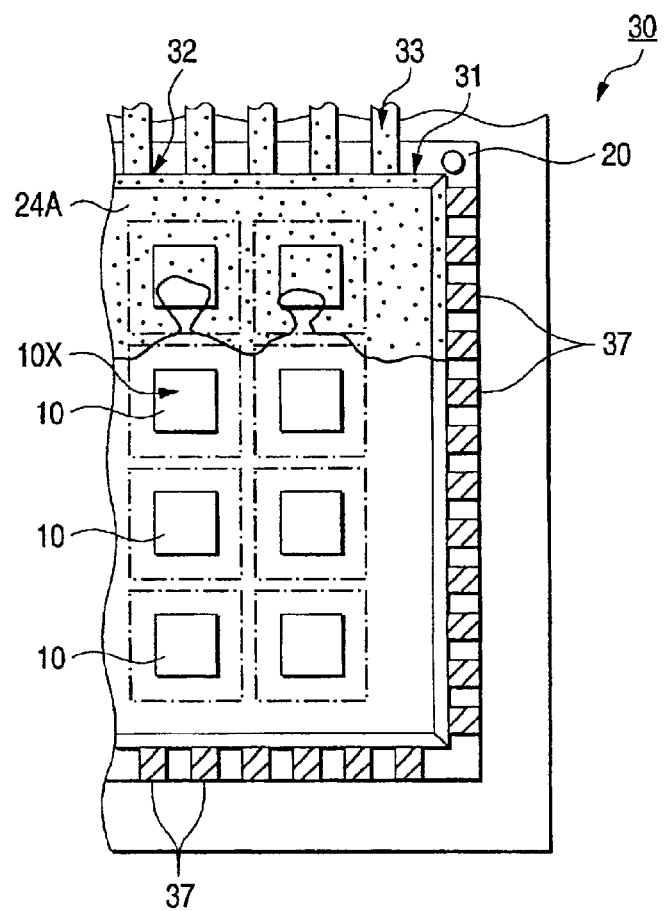
FIG. 13A is a schematic plan view illustrating the resin molding process used in fabricating the device of the embodiment 1.
Figure 13B:
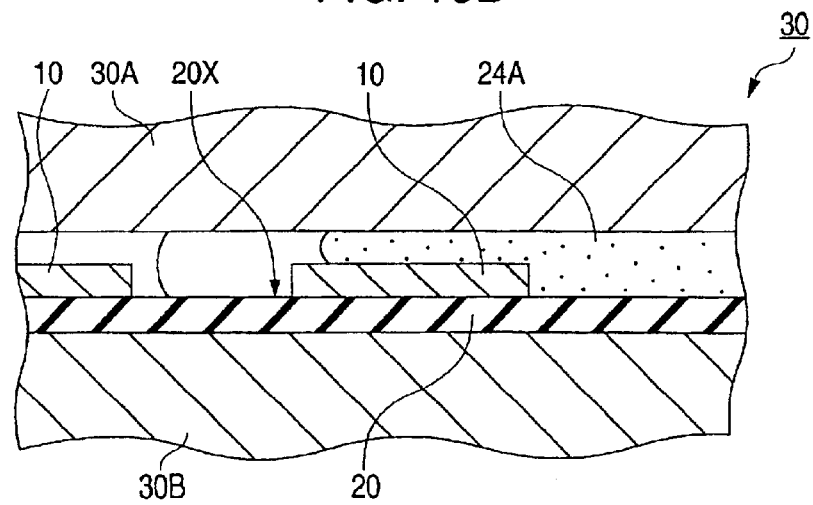
FIG. 13B is a schematic sectional view thereof.
Figure 14A:
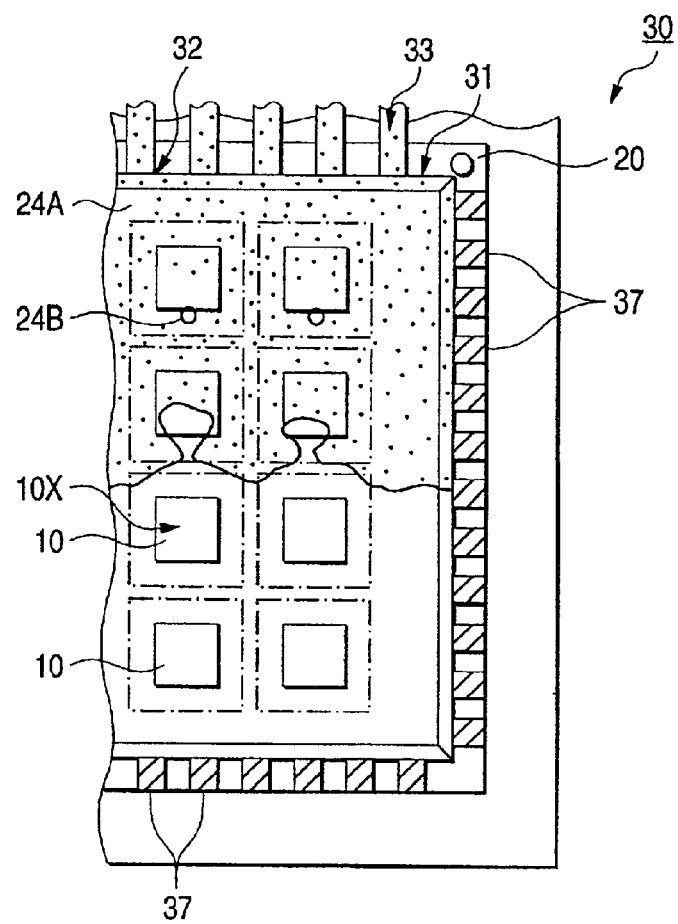
FIG. 14A is a schematic plan view illustrating the resin molding process used in fabricating the semiconductor device of the embodiment 1.
Figure 14B:
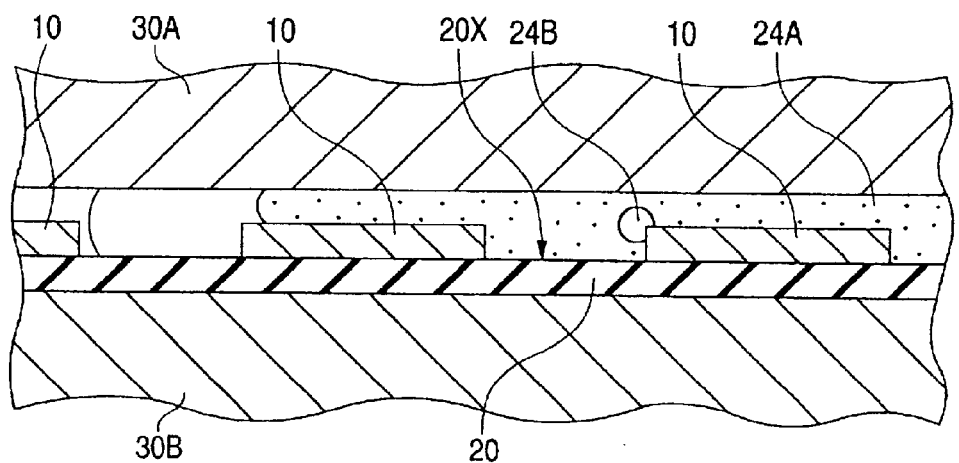
FIG. 14B is a schematic sectional view thereof.

In this process, as shown in FIG. 12A, the plurality of gates 32 are arranged along one of the two long sides of the cavity 31 facing each other so as to evenly fill the inside of the entire cavity 31 with the resin 24A, and, therefore, the resin 24A is injected inside the cavity 31 from one long side to the other long side of the substrate 20. At this time, the semiconductor chips 10 are arranged so that two sides facing each other are almost orthogonal to the injecting direction S of the resin 24A.

Figure 15A:
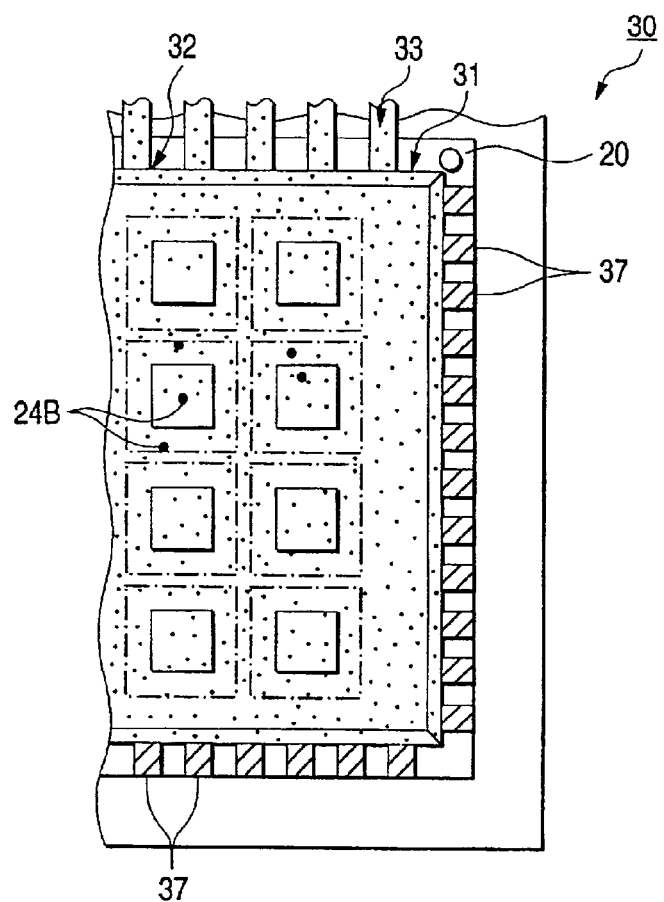
FIG. 15A is a schematic plan view illustrating the resin molding process used in fabricating the semiconductor device of the embodiment 1.
Figure 15B:
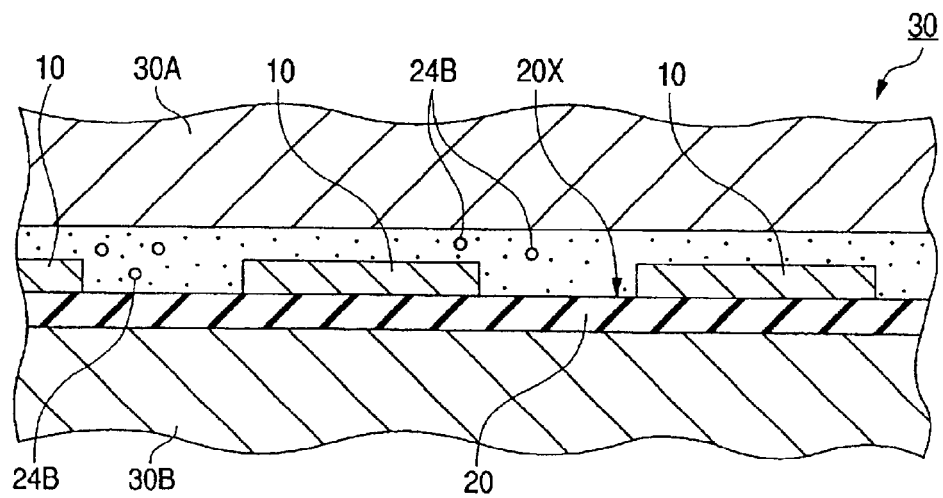
FIG. 15B is a schematic sectional view thereof.

The resin 24A injected inside the cavity 31 flows from one long side to the other long side of the substrate 20 as shown in FIGS. 12A to 14B, and the inside of the cavity 31 is filled, as shown in FIGS. 15A and 15B.

The resin 24A injected inside the cavity 31 flows along the main surface 10X and the side surface of the semiconductor chip 10. The resin 24A flowing along the main surface 10X and the side surfaces of the semiconductor chip 10 runs into the areas between the semiconductor chips 10. However, the resin 24A flowing along the main surface 10X of the semiconductor chip 10 runs slower than the resin 24A flowing along the side surfaces of the semiconductor chip 10. Therefore, voids 24B are generated at positions where the resin 24A flowing along the main surface 10X of the semiconductor chip 10 meets the resin 24A flowing along the side surfaces of the semiconductor chip 10 (see FIGS. 14A and 14B). On the other hand, since impurities, such as fats and oils, remaining on the main surface 20X of the substrate 20, have been removed in the aforesaid cleaning process, and since the main surface 20X of the substrate 20 has been roughened, the wettability of the resin 24A is enhanced with respect to the main surface 20X of the substrate 20. For this reason, the resin 24A flowing along the side surfaces of the semiconductor chip 10 is allowed to easily enter the positions behind the semiconductor chips 10 with respect to the injecting direction S of the resin 24A. Accordingly, the voids 24B generated at the positions where the resin 24A flowing along the main surface 10X of the semiconductor chip 10 meets the resin 24A flowing along the side surfaces of the semiconductor chip 10 (see FIGS. 14A and 14B) are dislodged from the main surface 20X of the substrate 20. The voids 24B thus dislodged from the main surface 20X of the substrate 20 are able to easily move in response to the flow of the resin 24A in the resin injecting process. Therefore, the voids 24B do not remain at positions hiding behind the semiconductor chips 10, as shown in FIGS. 15A and 15B. The voids 24E dislodged from the main surface 20X of the substrate 20 become smaller and smaller due to the flow of the resin 24A as they move. They become smaller to the extent of not causing the popcorn phenomenon during temperature cycle testing.

That is, cleaning treatment is applied to the main surface 20X of the substrate 20 to remove impurities, such as fats and oils, remaining on the main surface 20X of the substrate 20 before forming the resin enclosure 24. Thereby, the wettability of the resin 24A to the main surface 20X of the substrate 20 is enhanced and the resin 24A flowing along the side surfaces of the semiconductor chip 10 is allowed to easily enter the positions hiding behind the semiconductor chips 10 with respect to the injecting direction S of the resin 24A. Thus, the voids 24B generated at the positions where the resin 24A flowing along the main surface 10X of the semiconductor chip 10 meets the resin 24A flowing along the side surfaces of the semiconductor chip 10 are dislodged from the main surface 20X of the substrate 20.

Additionally, cleaning treatment is performed by plasma cleaning, and, thereby, the main surface 20X of the substrate 20 is roughened, in addition to the removal of impurities, such as fats and oils, remaining on the main surface 20X of the substrate 20. Therefore, the wettability of the resin 24A with respect to the main surface 20X of the substrate 20 is further enhanced. The wettability of the resin 24A is enhanced by removing impurities, such as fats and oils, remaining on the surface where the resin flows and by roughening the surface where the resin flows. However, naturally, the enhancement of the wettability of the resin by surface roughening is limited.

Figure 16A:
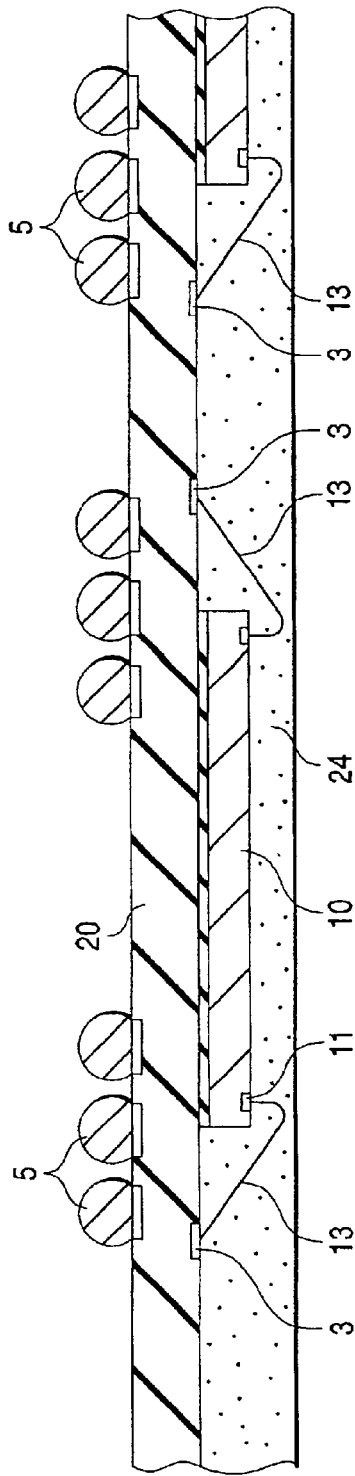
FIGS. 16A and 16B are schematic sectional views illustrating steps in the fabrication of the semiconductor device of the embodiment 1.
Figure 16B:
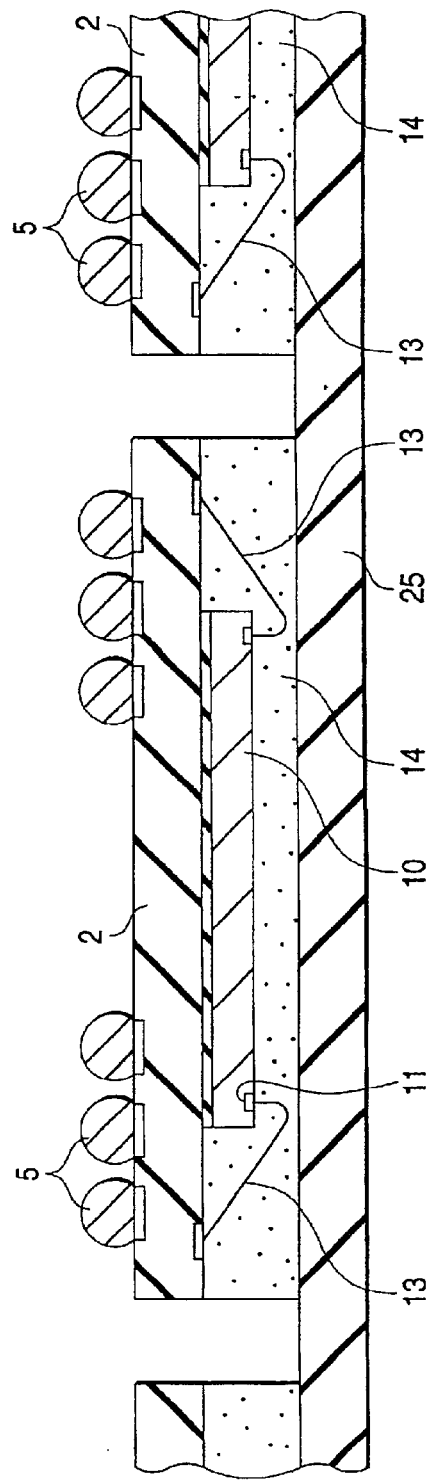

Then, as shown in FIG. 16A, projecting electrodes 15 are formed on the surfaces of electrode pads 5 disposed on the back surface of the substrate 20 by ball feeding, for example. Then, the substrate 20 is attached and fixed to a dicing sheet 25 so that the resin enclosure 24 being block-molded faces the dicing sheet 25. After that, as shown in FIG. 16B, the resin enclosure 24 and the substrate 20 are simultaneously separated into respective semiconductor chips 10 (each of the product forming areas). The semiconductor device 1A shown in FIGS. 1A to 3 is almost complete in this process.

In this manner, according to the embodiment, the following effects can be obtained.

In the method for manufacturing the semiconductor device 1A, the method comprises forming the resin enclosure 24 for block-molding the plurality of semiconductor chips 10 by placing the plurality of semiconductor chips 10 inside the cavity 31 of the molding die 30 along with the substrate 20 and then injecting the resin 24A inside the cavity 31 from one long side to the other long side of the main surface 20X of the substrate 20, the plurality of semiconductor chips 10 being mounted on the main surface 20X of the substrate 20 from one long side to the other long side of the main surface 20X with a predetermined spacing, the other long side facing to one long side, wherein the method further comprises removing impurities remaining on the main surface 20X of the substrate 20 by plasma cleaning before forming the resin enclosure 24.

Accordingly, impurities, such as fats, oils and organic solvents, remaining on the main surface 20X of the substrate 20 are removed, and a material having a high wettability to the resin 24A is more fully exposed on the main surface 20X of the substrate 20, or the main surface 20X of the substrate 20 is formed to have fine bumps and dips. Thereby, the wettability of the resin 24A to the main surface 20X of the substrate 20 is enhanced, and the flow accompanying the injection of the resin 24A can accelerate the removal of the voids in the resin 24A. Consequently, an improvement the yield of the semiconductor devices 1A can be achieved.

An example in which a substrate 20 having a resin film 4 on a main surface 20X thereof was described as an embodiment. However, resin substrates allow impurities such as fats, oils and organic solvents contained in the resin substrates, to be outgassed by heat treatment in the fabricating process, even though the main surface 20X does not have a resin film 4.

Furthermore, although an example has been described in which a glass-epoxy substrate is used as the substrate 20, the invention is also effective when a substrate made of BT resin is used.

Besides, when resin tape is used as the substrate 20, warpage is intensified due to the cure shrinkage of the resin enclosure, and thus the amount of filler added has to be increased. In such a case, voids tend to be generated because the flowability of the resin is decreased.

(Embodiment 2)

Figure 17:
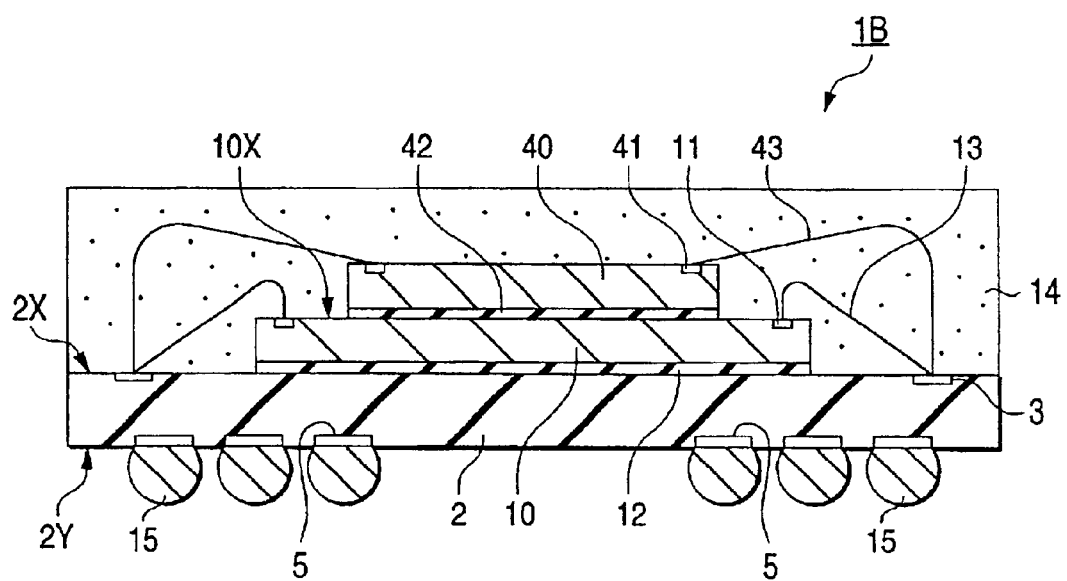
FIG. 17 is a schematic sectional view illustrating the configuration of a semiconductor device of an embodiment 2 of the invention.

FIG. 17 is a schematic sectional view of a semiconductor device representing an embodiment 2 of the invention.

As shown in FIG. 17, a semiconductor device 1B of the embodiment 2 is basically configured to have the same configuration as the aforesaid embodiment 1, but differs in the following way. That is, a semiconductor chip 10 is attached and fixed to a main surface 2X of a substrate 2 through a bonding layer 12, and a semiconductor chip 40 is attached and fixed to a main surface 10X of the semiconductor chip 10 through a bonding layer 42. The semiconductor chip 40 is formed to have a plane size smaller than that of the semiconductor chip 10. Electrode pads 41, which are arranged on a main surface of the semiconductor chip 40, are electrically connected to connecting parts 3 formed on a main surface 2X of the substrate 2 through bonding wires 43. The semiconductor chips 10 and 40 are encapsulated by a resin enclosure 14.

Hereafter, the method of manufacture of the semiconductor device 1B will be described with reference to FIGS. 18A to 19B. FIGS. 18A to 19B are schematic sectional views illustrating steps in the manufacture of the semiconductor device.

First, a substrate 20 is prepared. Then, the bonding layer 12, made of an epoxy thermosetting resin, for example, is deposited on a chip mounting area in each of the product forming areas on a main surface 20X of the substrate 20. A semiconductor chip 10 is mounted on the chip mounting area through the bonding layer 12. Heat treatment is applied to cure the bonding layer 12, and the semiconductor chip 10 is attached and fixed in the chip mounting area. In this process, the substrate 20 is heated at a temperature of about 180° C., for example, and thus a natural oxide layer is deposited on the surfaces of the electrode pads 11 of the semiconductor chip 10 and the surfaces of the connecting parts 3 of the substrate 20. Additionally, impurities, such as fats, oils and organic solvents, contained in a resin film 4 are outgassed to contaminate the main surface of the substrate 20, and the surfaces of the connecting parts 3 and the electrode pads 11.

Then, the main surface 10X of each of the semiconductor chips 10 is formed with a bonding layer 42 made of an epoxy thermosetting resin. The semiconductor chip 40 is mounted on the main surface 10X of the semiconductor chip 10 through the bonding layer 42. Heat treatment is applied to cure the bonding layer 42. The semiconductor chip 40 is attached and fixed to the semiconductor chip 10, as shown in FIG. 18A. In this process, the substrate 20 is heated at a temperature of about 180° C., for example, and thus a natural oxide layer is deposited on the surfaces of the electrode pads 11 of the semiconductor chip 10 and the surfaces of the connecting parts 3 of the substrate 20. Furthermore, impurities, such as fats and oils, contained in the resin film 4 are outgassed so as to contaminate the main surface of the substrate 20 and the surfaces of the connecting parts 3 and the electrode pads 11.

Subsequently, as shown in FIG. 18B, the impurities remaining on the surfaces of the electrode pads 11 and 41 of the semiconductor chips 10 and 40 and the surfaces of the connecting parts 3 of the substrate 20 are removed by plasma cleaning using an oxygen or argon gas.

Figure 19A:
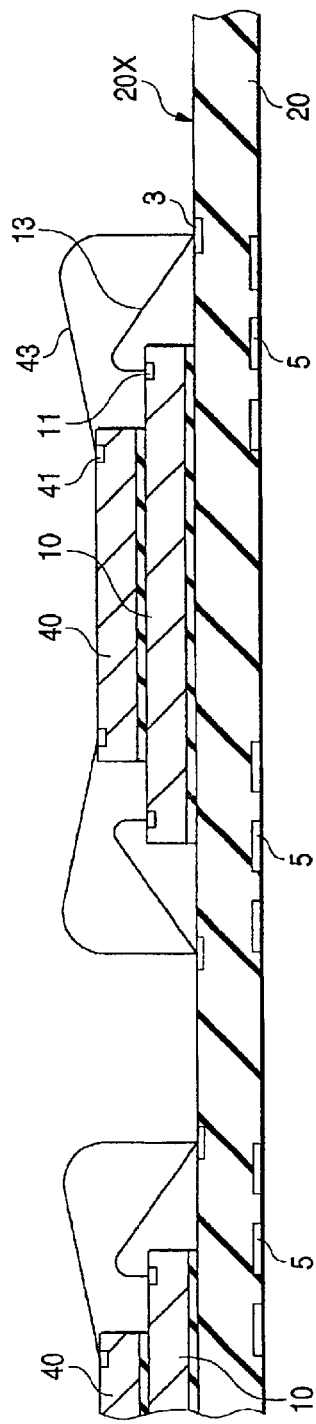
FIGS. 19A and 19B are schematic sectional views illustrating steps in the fabrication of the semiconductor device of the embodiment 2.

Then, as shown in FIG. 19A, the electrode pads 11 of the semiconductor chip 10 are electrically connected to the connecting parts 3 of the substrate 20 using bonding wires 13, and the electrode pads 41 of the semiconductor chip 40 are electrically connected to the connecting parts 3 of the substrate 20 using the bonding wires 43. In this process, the substrate 20 is heated at a temperature of about 125° C., for example, and thus impurities, such as fats and oils, contained in the resin film 4 are outgassed so as to contaminate the main surface of the substrate 20.

Figure 19B:
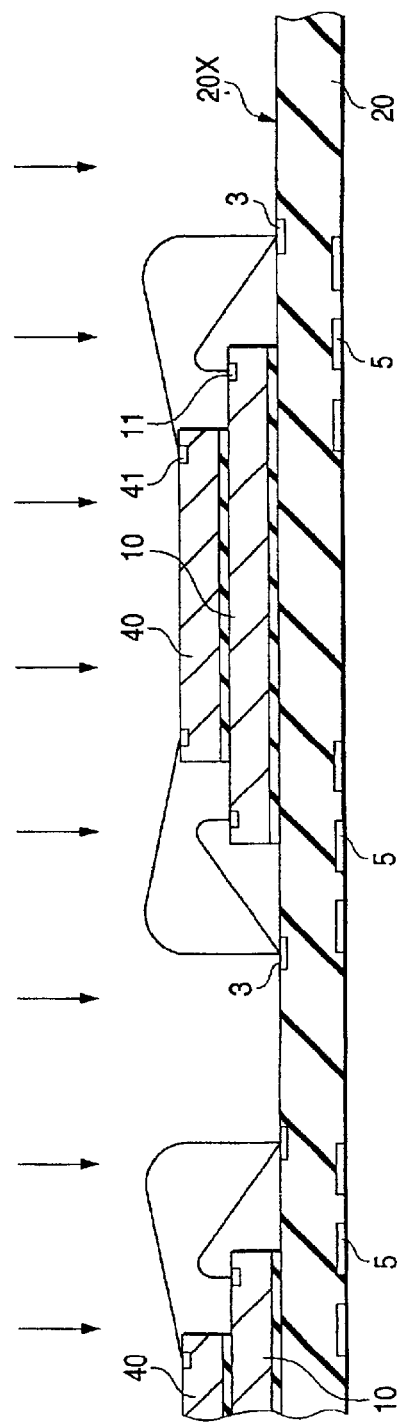

Subsequently, as shown in FIG. 19B, the impurities remaining on the main surface 20X of the substrate 20 are removed by plasma cleaning using an oxygen or argon gas. In this process, plasma cleaning can roughen the main surface 20X of the substrate 20, and, therefore, the removal of impurities and roughening of the main surface 20X of the substrate 20 can be performed.

Then, similar to the aforementioned embodiment 1, the substrate 20 is positioned between an upper mold 30A and a lower or bottom mold 30B of a molding die 30. The plurality of semiconductor chips 10 mounted on the main surface 20X of the substrate 20 and each of the plurality of semiconductor chips 40 layered on the respective semiconductor chips 10 are placed inside a cavity 31 of the molding die 30 along with the substrate 20. A resin is then injected inside the cavity 31 from pots 38 through culls 35, main runners 34, subrunners 33 and gates 32. A resin enclosure is formed for block-molding the plurality of semiconductor chips 10 and 40 mounted on the main surface 20X of the substrate 20.

After that, the same process as the aforesaid embodiment 1 is carried out, and, thereby, the semiconductor device 1B shown in FIG. 17 can be manufactured.

In manufacturing the semiconductor device 1B of the embodiment 2, two semiconductor chips 10 and 40 are laminated on the main surface 20X of the substrate 20. Thus, voids tend to be generated at the positions hiding behind the semiconductor chips 10 and 40 with respect to the injecting direction S of the resin 24A. However, since cleaning treatment is applied to the main surface 20X of the substrate 20 before the resin enclosure is formed, the same effects as the aforementioned embodiment 1 can be obtained.

(Embodiment 3)

Figure 20:
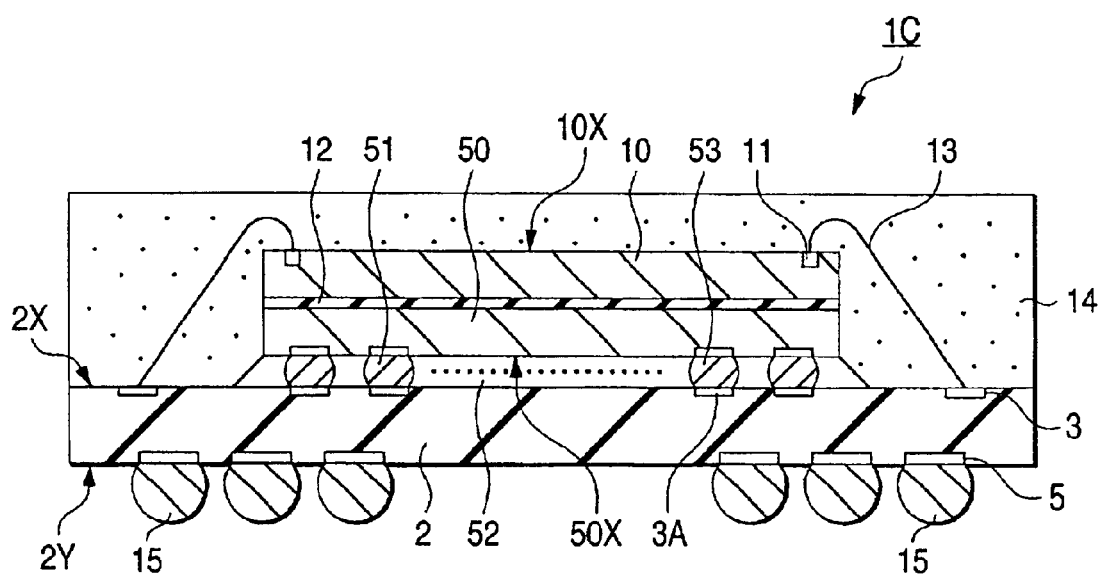
FIG. 20 is a schematic sectional view illustrating the configuration of a semiconductor device of an embodiment 3 of the invention.

FIG. 20 is a schematic sectional view of a semiconductor device according to an embodiment 3 of the invention.

As shown in FIG. 20, the semiconductor device 1C of the embodiment 3 is basically configured to have the same configuration as the embodiment 2, but varies in the following way. That is, a semiconductor chip 50 is mounted on a main surface 2X of a substrate 2 through projecting electrodes 53, and a semiconductor chip 10 is attached and fixed to the other main surface (back surface), facing one main surface of the semiconductor chip 50, through a bonding layer 12. Electrode pads 51 arranged on the main surface of the semiconductor chip 50 are electrically connected to electrode pads 3A arranged on the main surface 2X of the substrate 2 through the projecting electrodes 53. An epoxy thermosetting resin 52, for example, is injected into the space between the semiconductor chip 50 and the substrate 2. Electrode pads 11 of the semiconductor chip 10 are electrically connected to connecting parts 3 of the substrate 2 through bonding wires 13. The semiconductor chips 50 and 10 are encapsulated by a resin enclosure 14.

Hereafter, the method of manufacture of the semiconductor device 1C will be described with reference to FIGS. 21A, 21B and 22A, 22B. FIGS. 21A to 22B are schematic sectional views illustrating steps in the manufacture of the semiconductor device.

First, the substrate 2 is prepared, and then the projecting electrodes 53 are molten in a state in which the projecting electrodes 53 are disposed between the electrode pads 3A arranged in a chip mounting area of each of the product forming areas on the main surface 2X of the substrate 2 and the electrode pads 51 arranged on the main surface of the semiconductor chip 50, and the semiconductor chip 50 is mounted on each of the product forming areas on the main surface of the substrate 2. In this process, the substrate 2 is heated at a temperature of about 205° C., for example, and thus a natural oxide layer is deposited on the surfaces of the connecting parts 3 of the substrate 2. Additionally, impurities, such as fats, oils and organic solvents, contained in a resin film 4 are outgassed so as to contaminate the main surface and the surfaces of the connecting parts 3 of the substrate 2.

Then, the epoxy thermosetting resin 52, for example, is injected into the space between the semiconductor chip 50 and the substrate 2, and, subsequently, heat treatment is applied to cure the thermosetting resin 52. In this process, the substrate 2 is heated at a temperature of about 150° C., for example, and thus a natural oxide layer is deposited on the surfaces of the connecting parts 3 of the substrate 2. Furthermore, impurities, such as fats, oils and organic solvents, contained in the resin film 4 are outgassed so as to contaminate the main surface and the surfaces of the connecting parts 3 of the substrate 2.

Figure 21A:
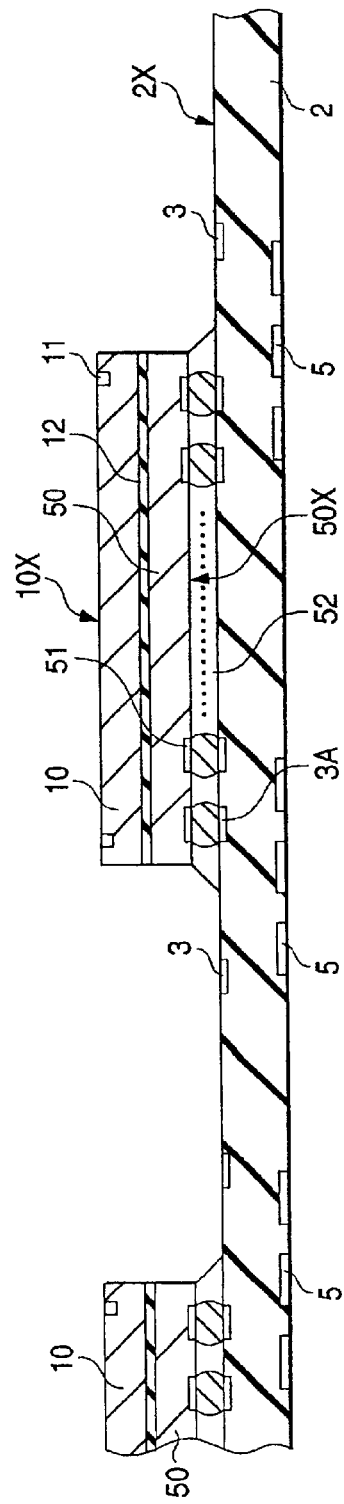
FIGS. 21A and 21B are schematic sectional views illustrating steps in the fabrication of the semiconductor device of the embodiment 3.

Then, the bonding layer 12, made of an epoxy thermosetting resin, for example, is deposited on the back surface of each of the semiconductor chips 50. The chip 10 is mounted on the back surface of the semiconductor chips 50 through the bonding layer 12. Heat treatment is applied to cure the bonding layer 12, and the semiconductor chip 10 is attached and fixed to the semiconductor chip 50, as shown in FIG. 21(A). In this process, the substrate 2 is heated at a temperature of about 180° C., for example, and thus a natural oxide layer is deposited on the surfaces of the electrode pads 11 of the semiconductor chip 10 and the surfaces of the connecting parts 3 of the substrate 2. Moreover, impurities, such as fats and oils, contained in the resin film 4 are outgassed so as to contaminate the main surface of the substrate 2 and the surfaces of the electrode pads 11 and the connecting parts 3.

Figure 21B:
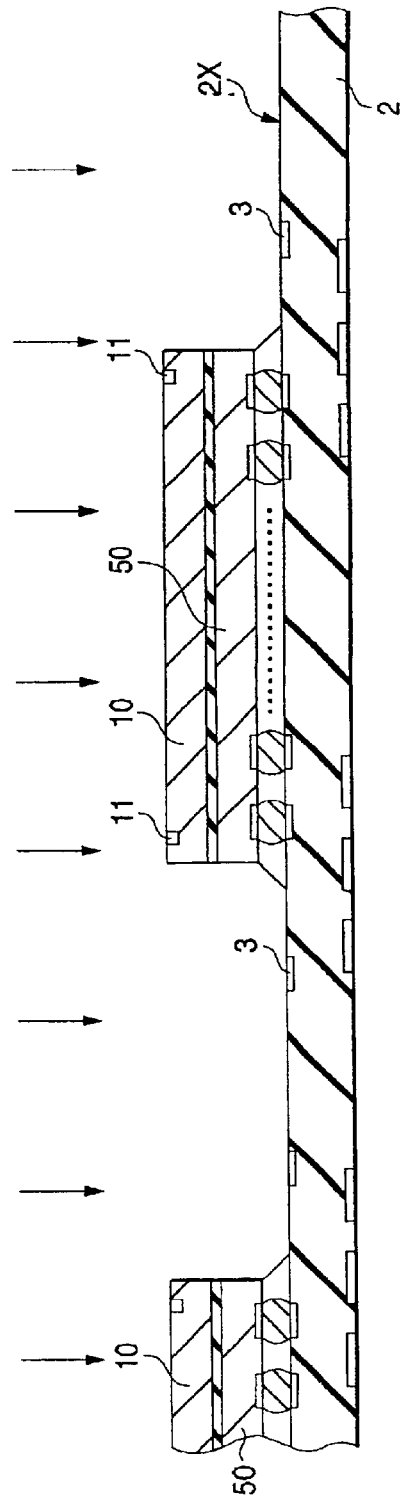
Figure 23A:
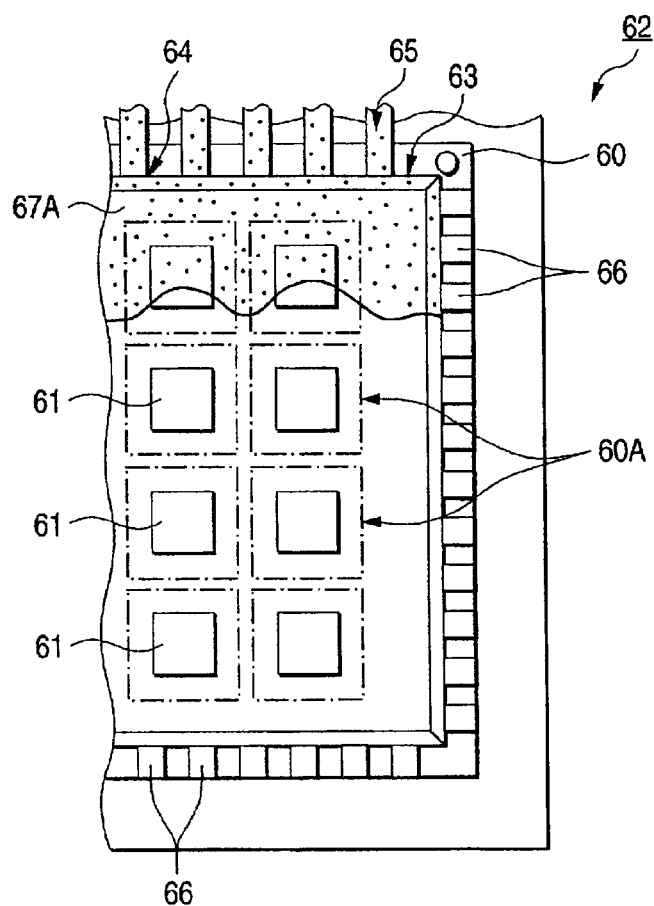
FIG. 23A is a schematic plan view illustrating the rein molding process used in fabricating a conventional semiconductor device.
Figure 23B:
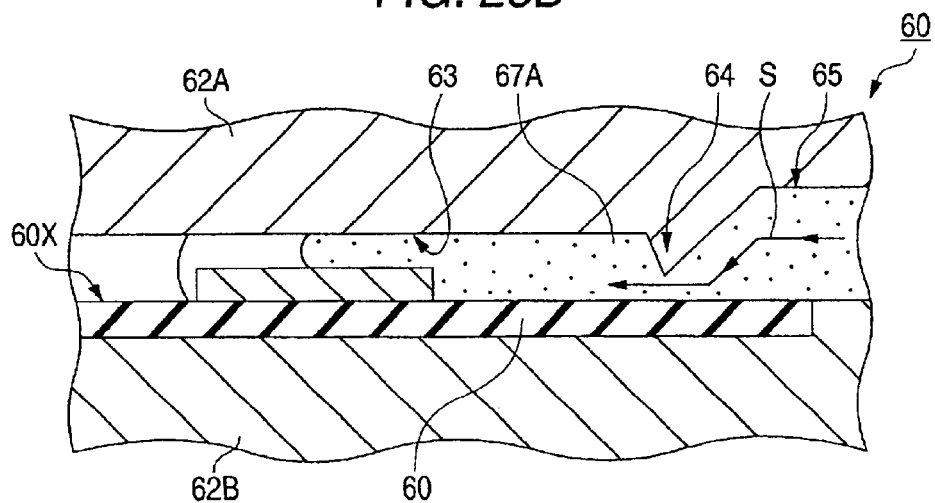
FIG. 23B is a schematic sectional view thereof.
Figure 24A:
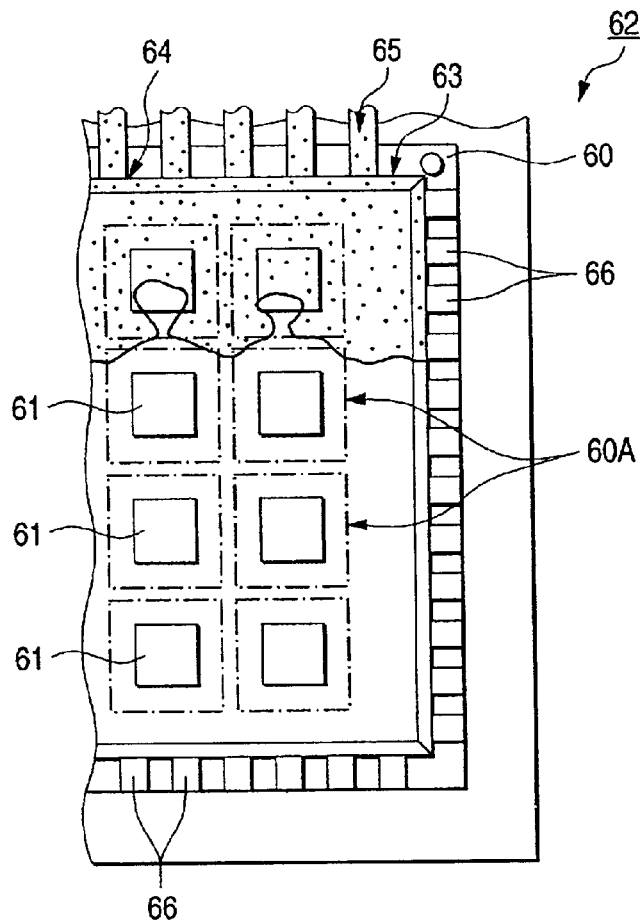
FIG. 24A is a schematic plan view illustrating the rein molding process used in fabricating the conventional semiconductor device.
Figure 24B:
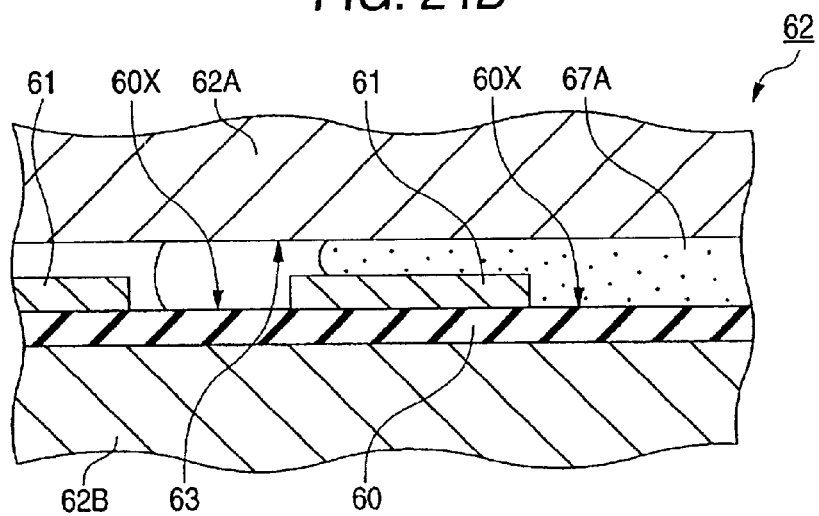
FIG. 24B is a schematic: sectional view thereof.
Figure 25A:
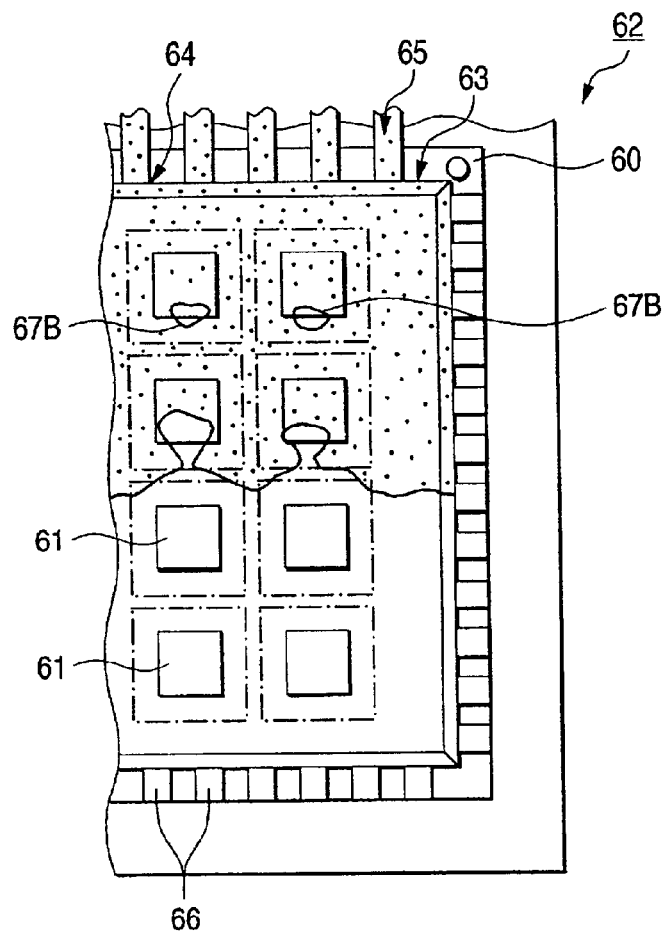
FIG. 25A is a schematic plan view illustrating the rein molding process used in fabricating the conventional semiconductor device.
Figure 25B:
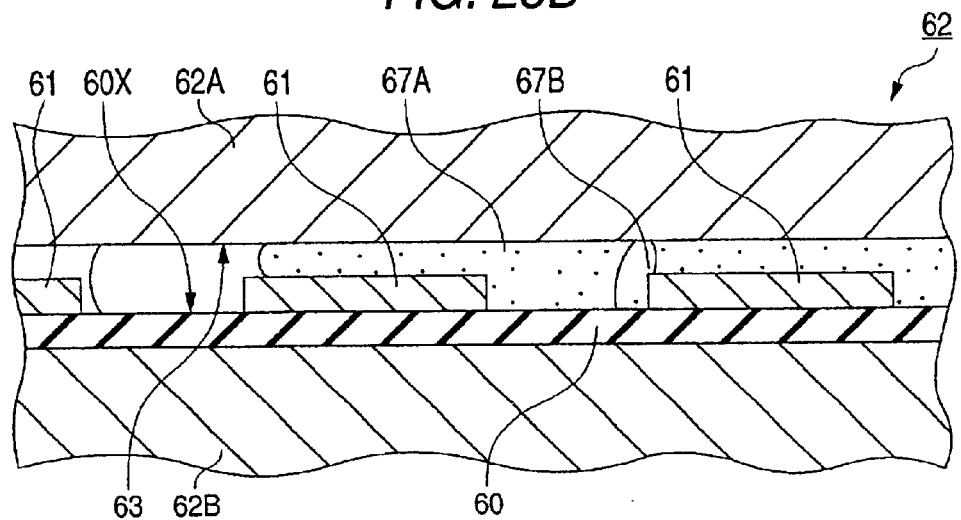
FIG. 25B is a schematic: sectional view thereof.
Figure 26A:
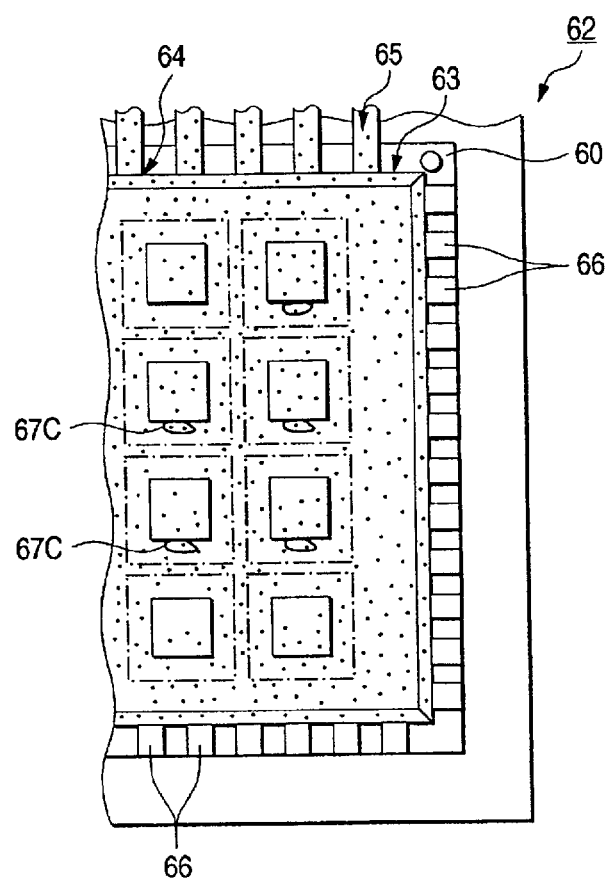
FIG. 26A is a schematic plan view illustrating the rein molding process used in fabricating the conventional semiconductor device.
Figure 26B:
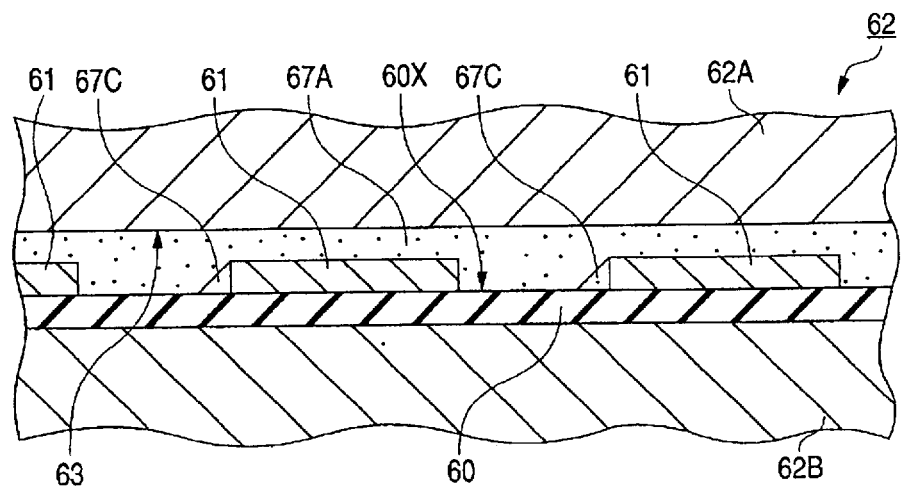
FIG. 26B is a schematic, sectional view thereof.

Subsequently, as shown in FIG. 21(B), the impurities remaining on the surfaces of the electrode pads 11 of the semiconductor chip 10 and the surfaces of the connecting parts 3 of the substrate 2 are removed by plasma cleaning using an oxygen or argon gas.

Then, as shown in FIG. 22(A), the electrode pads 11 of the semiconductor chip 10 are electrically connected to the connecting parts 3 of the substrate 2 by bonding wires 13. In this process, the substrate 2 is heated at a temperature of about 125° C., for example, and thus impurities, such as fats and oils, contained in the resin film 4 are outgassed so as to contaminate the main surface of the substrate 2.

Subsequently, as shown in FIG. 22(B), the impurities remaining on the main surface 2X of the substrate 2 are removed by plasma cleaning using an oxygen or argon gas. In this process, plasma cleaning can roughen the main surface 2X of the substrate 2, and, therefore, the removal of impurities and roughening the main surface 2X of the substrate 2 can be performed.

Then, as similar to the aforementioned embodiments 1 and 2, the substrate 2 is positioned between an upper mold 30A and a lower or bottom mold 30B of a molding die 30. The plurality of semiconductor chips 50 mounted on the main surface 2X of the substrate 2 and each of the plurality of semiconductor chips 10 layered on the respective semiconductor chips 50 are placed inside a cavity 31 of the molding die 30 along with the substrate 2. A resin is then injected inside the cavity 31 from pots 38 through culls 35, main runners 34, subrunners 33 and gates 32. A resin enclosure is formed for block-molding the plurality of semiconductor chips 50 and 10 mounted on the main surface 2X of the substrate 2.

After that, the same process as the aforesaid embodiment 1 is applied, and, thereby, the semiconductor device 1C shown in FIG. 20 can be manufactured.

In manufacturing the semiconductor device 1C of the embodiment 3, two semiconductor chips 50 and 10 are laminated on the main surface 2X of the substrate 2. Thus, voids tend to be generated at the positions hiding behind the semiconductor chips 50 and 10 with respect to the injecting direction S of the resin 24A. However, since cleaning treatment is applied to the main surface 2X of the substrate 2 by plasma cleaning before the resin enclosure is formed, the same effects as the aforementioned embodiment 1 can be obtained.

As described above, the invention made by the inventors has been specifically described with reference to embodiments thereof. However, it is needless to say that the invention is not limited to the embodiments, which can be modified variously within the scope of the invention, not deviating from the teachings thereof. For example, the invention can be applied to a technique for manufacturing a semiconductor device having a CSP structure.

Additionally, the invention can be applied to a technique for manufacturing a semiconductor device having an MCM structure where a plurality of semiconductor chips are mounted on a substrate.

In brief, the effect obtained by the representative aspects of the invention disclosed in the present application is as follows. According to the invention, an improvement of the yield of semiconductor devices can be achieved.

What is claimed is:

1. A method of manufacturing a semiconductor device, comprising the steps of:

providing a substrate having a main surface, a back surface opposite the main surface, a plurality of product forming areas arranged in a matrix, with spaces therebetween, on the main surface and connecting electrodes formed on each of the plurality of product forming areas;

providing a plurality of semiconductor chips having a main surface, a back surface opposite the main surface thereof and electrode pads formed on the main surface thereof;

mounting the plurality of semiconductor chips on the plurality of product forming areas, respectively;

after the mounting step, treating the main surface of the substrate by plasma;

providing a molding die having a cavity therein;

after the treating step by plasma, arranging the substrate in the molding die as the plurality of semiconductor chips are positioned in the cavity and the plurality of product forming areas are facing to the cavity;

after the arranging step, block molding a resin enclosure sealing the plurality of semiconductor chips and the plurality of product forming areas by injecting resin into the cavity; and after the block molding step, cutting the resin enclosure and the substrate along a periphery of each of the product forming areas, wherein the cavity of the molding die has two sides opposed to each other, a plurality of gates formed on one side, of the two sides, and a plurality of air vents formed on the other side of the two sides, and wherein in the block molding step, the resin is injected into the cavity from the gates on the one side to the air vents on the other side.

2. A method of manufacturing a semiconductor device according to claim 1, wherein in the treating step by plasma, impurities remaining on the main surface of the substrate are removed.

3. A method of manufacturing a semiconductor device according to claim 1, wherein in the treating step by plasma, the main surface of the substrate is roughened.

4. A method of manufacturing a semiconductor device according to claim 3, wherein the substrate is comprised of resin.

5. A method of manufacturing a semiconductor device according to claim 1, wherein the resin enclosure comprises a plurality of fillers.

6. A method of manufacturing a semiconductor device according to claim 5, wherein a volume content of the plurality of fillers in the resin enclosure is more than 80 volume percent.

7. A method of manufacturing a semiconductor device according to claim 6, wherein the plurality of fillers are comprised of silica fillers.

8. A method of manufacturing a semiconductor device according to claim 1, wherein in the mounting step, the electrode pads of the semiconductor chips are electrically connected with connecting electrodes of corresponding product forming areas.

9. A method of manufacturing a semiconductor device according to claim 8, wherein in the mounting step, the substrate is heat treated.

10. A method of manufacturing a semiconductor device according to claim 1, wherein in the block molding step, peripheral space of the cavity is provided between the plurality of product forming areas and the plurality of air vents, and wherein a width of the peripheral space is larger than a width of spaces between the plurality of the product forming areas in plan view.

11. A method of manufacturing a semiconductor device according to claim 10, wherein in the treating step by plasma, impurities remaining on the main surface of the substrate are removed.

12. A method of manufacturing a semiconductor device according to claim 10, wherein in the treating step by plasma, the main surface of the substrate is roughened.

13. A method of manufacturing a semiconductor device according to claim 12, wherein the substrate is comprised of resin.

14. A method of manufacturing a semiconductor device according to claim 10, wherein the resin enclosure comprises a plurality of fillers.

15. A method of manufacturing a semiconductor device according to claim 14, wherein a volume content of the plurality of fillers in the resin enclosure is more than 80 volume percent.

16. A method of manufacturing a semiconductor device according to claim 15, wherein the plurality of fillers are comprised of silica fillers.

17. A method of manufacturing a semiconductor device according to claim 10, wherein in the mounting step, the electrode pads of the semiconductor chips are electrically connected with connecting electrodes of corresponding product forming areas.

18. A method of manufacturing a semiconductor device according to claim 17, wherein in the mounting step, the substrate is heat treated.

19. A method of manufacturing a semiconductor device according to claim 1, wherein in the mounting step, the electrode pads of the semiconductor chips are electrically connected with connecting electrodes of corresponding product forming areas.

20. A method of manufacturing a semiconductor device according to claim 1, wherein the treating step by plasma is performed so as to increase wettability to said substrate of the resin, of the resin enclosure, used in the step of block molding.

21. A method of manufacturing a semiconductor device according to claim 20, wherein said wettability of the resin, of the resin enclosure, to the substrate, is sufficiently increased by the treating step by plasma so as to dislodge voids during the block molding.

22. A method of manufacturing a semiconductor device according to claim 20, wherein said wettability of the resin, of the resin enclosure, to the substrate, is sufficiently increased by the treating step by plasma so as to dislodge voids, during the block molding, that are behind the semiconductor chips in the direction of flow of the resin during the block molding.

23. A method of manufacturing a semiconductor device according to claim 22, wherein the treating step by plasma uses an oxygen or argon gas.

24. A method of manufacturing a semiconductor device according to claim 20, wherein the treating step by plasma uses an oxygen or argon gas.

25. A method of manufacturing a semiconductor device according to claim 1, wherein the treating step by plasma uses an oxygen or argon gas.

26. A method of manufacturing a semiconductor device according to claim 1, wherein said cavity has additional sides to said two sides, the additional sides also having air vents.

27. A method of manufacturing a semiconductor device according to claim 1, wherein said cavity has four sides in total, including said two sides opposed to each other and an additional two sides opposed to each other, the four sides forming a quadrilateral, and wherein said additional two sides also have air vents.

28. A method of manufacturing a semiconductor device according to claim 1, wherein said plasma treatment is performed such that, in the block molding step, voids at positions behind the semiconductor chips in the direction of flow of the resin are dislodged and move in response to the flow of the resin in the block molding step.

29. A method of manufacturing a semiconductor device according to claim 1, wherein the plasma treatment is performed such that, in the block molding step, voids are dislodged and move in response to the flow of resin in the block molding step.

30. A method of manufacturing a semiconductor device according to claim 10, wherein said cavity has additional sides to said two sides, the additional sides also having air vents.

31. A method of manufacturing a semiconductor device according to claim 10, wherein said cavity has four sides in total, including said two sides opposed to each other and an additional two sides opposed to each other, the four sides forming a quadrilateral, and wherein said additional two sides also have air vents.

32. A method of manufacturing a semiconductor device according to claim 10, wherein said plasma treatment is performed such that, in the block molding step, voids at positions behind the semiconductor chips in the direction of flow of the resin are dislodged and move in response to the flow of the resin in the block molding step.

33. A method of manufacturing a semiconductor device according to claim 10, wherein the plasma treatment is performed such that, in the block molding step, voids are dislodged and move in response to the flow of resin in the block molding step.

34. A method of manufacturing a semiconductor device according to claim 31, wherein of the four sides of the cavity, two of the sides are longer than the other two sides, said one side having the plurality of gates and said other side, opposite thereto, being the two longer sides.

35. A method of manufacturing a semiconductor device according to claim 1, wherein said cavity has additional sides to said two sides, and wherein said one side having the plurality of gates and said other side, opposite thereto, are longer than the additional side of the cavity.

36. A method of manufacturing a semiconductor device according to claim 1, wherein after the step of mounting, at least fats and oils are on the main surface of the substrate, and the fats and oils are removed by the treating step by plasma.

37. A method of manufacturing a semiconductor device according to claim 1, wherein in the block molding step the resin is injected from the gates on the one side so as to follow along the main surface of the substrate.

* * * * *